(12) United States Patent
Kwon et al.

(10) Patent No.: US 10,930,685 B2
(45) Date of Patent: Feb. 23, 2021

(54) IMAGE SENSOR INCLUDING A SHIELD STRUCTURE

(71) Applicant: SAMSUNG ELECTRONICS CO., LTD., Suwon-si (KR)

(72) Inventors: Doowon Kwon, Seongnam-si (KR); Ingyu Baek, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/390,325

(22) Filed: Apr. 22, 2019

(65) Prior Publication Data

US 2020/0058688 A1 Feb. 20, 2020

(30) Foreign Application Priority Data

Aug. 17, 2018 (KR) .................. 10-2018-0096201

(51) Int. Cl.
| | | |
|---|---|---|
| *H01L 27/146* | (2006.01) | |
| *H01L 23/522* | (2006.01) | |
| *H01L 49/02* | (2006.01) | |
| *H01L 27/148* | (2006.01) | |
| *H04N 5/232* | (2006.01) | |

(52) U.S. Cl.
CPC .... *H01L 27/14603* (2013.01); *H01L 23/5223* (2013.01); *H01L 27/14609* (2013.01); *H01L 27/14612* (2013.01); *H01L 27/14623* (2013.01); *H01L 27/14643* (2013.01); *H01L 27/14689* (2013.01); *H01L 27/14812* (2013.01); *H01L 28/40* (2013.01); *H01L 23/5225* (2013.01); *H04N 5/23229* (2013.01)

(58) Field of Classification Search
CPC ............. H01L 27/146; H01L 27/14603; H01L 27/14609; H01L 27/14612; H01L 27/14623; H01L 27/14643; H01L 27/14689; H01L 23/5223; H01L 23/5225; H01L 28/40

See application file for complete search history.

(56) References Cited

U.S. PATENT DOCUMENTS

| | | | |
|---|---|---|---|
| 7,903,449 B2 | 3/2011 | Kajigaya et al. | |
| 8,420,429 B2 | 4/2013 | Jeon et al. | |
| 9,337,228 B2 | 5/2016 | Sa et al. | |
| 9,391,115 B1* | 7/2016 | Chung | H01L 27/14643 |
| 2007/0045665 A1* | 3/2007 | Park | H01L 27/14689 |
| | | | 257/204 |
| 2015/0357400 A1* | 12/2015 | Furuhashi | H01L 23/53219 |
| | | | 257/533 |
| 2016/0126282 A1 | 5/2016 | Chen et al. | |
| 2018/0097030 A1 | 4/2018 | Manabe et al. | |

FOREIGN PATENT DOCUMENTS

| | | |
|---|---|---|
| KR | 10-2010-0078719 A | 7/2010 |
| KR | 10-1585959 B1 | 1/2016 |

* cited by examiner

*Primary Examiner* — Sonya McCall-Shepard
(74) *Attorney, Agent, or Firm* — Lee IP Law, PC

(57) ABSTRACT

Disclosed is an image sensor comprising a first substrate including a plurality of pixels, a photoelectric conversion region in the first substrate at each of the pixels, a first capacitor on the first substrate, and a shield structure spaced apart from and surrounding the first capacitor.

18 Claims, 21 Drawing Sheets

IMAGE SENSOR INCLUDING A SHIELD STRUCTURE

CROSS-REFERENCE TO RELATED APPLICATION

Korean Patent Application No. 10-2018-0096201 filed on Aug. 17, 2018, in the Korean Intellectual Property Office, and entitled: "IMAGE SENSOR," is incorporated by reference herein in its entirety.

BACKGROUND

1. Field

Embodiments relate to an image sensor.

2. Description of the Related Art

An image sensor converts photonic images into electrical signals. Recent advances in computer and communication industries have led to strong demands in high performances image sensors in various consumer electronic devices such as digital cameras, camcorders, PCSs (Personal Communication Systems), game devices, security cameras, and medical micro-cameras.

An image sensor is classified into a charged coupled device (CCD) and a CMOS image sensor. The CMOS image sensor has a simple operating method, and a size of its product is possibly minimized because its signal processing circuit is integrated into a single chip. Also, the CMOS image sensor requires relatively small power consumption, which is useful in battery-powered applications. Accordingly, the use of the CMOS image sensor has been rapidly increasing as a result of advances in technology and implementation of high resolution.

SUMMARY

Embodiments are directed to an image sensor, including a first substrate including a plurality of pixels, a photoelectric conversion region in the first substrate at each of the pixels, a first capacitor on the first substrate, and a shield structure spaced apart from and surrounding the first capacitor.

Embodiments are also directed to an image sensor, including a substrate including a plurality of pixels, a photoelectric conversion region in the substrate at each of the pixels, at least one capacitor on the substrate, a conductive pattern adjacent to the at least one capacitor, and a shield structure between the at least one capacitor and the conductive pattern.

Embodiments are also directed to an image sensor, including a first substrate including a plurality of pixels, a photoelectric conversion region in the first substrate at each of the pixels, a first capacitor and a second capacitor on the first substrate, and a shield structure spaced apart from and surrounding the first capacitor and the second capacitor.

BRIEF DESCRIPTION OF THE DRAWINGS

Features will become apparent to those of skill in the art by describing in detail example embodiments with reference to the attached drawings in which.

DETAILED DESCRIPTION

Some example embodiments will now be described in detail with reference to the accompanying drawings.

Figure 1:
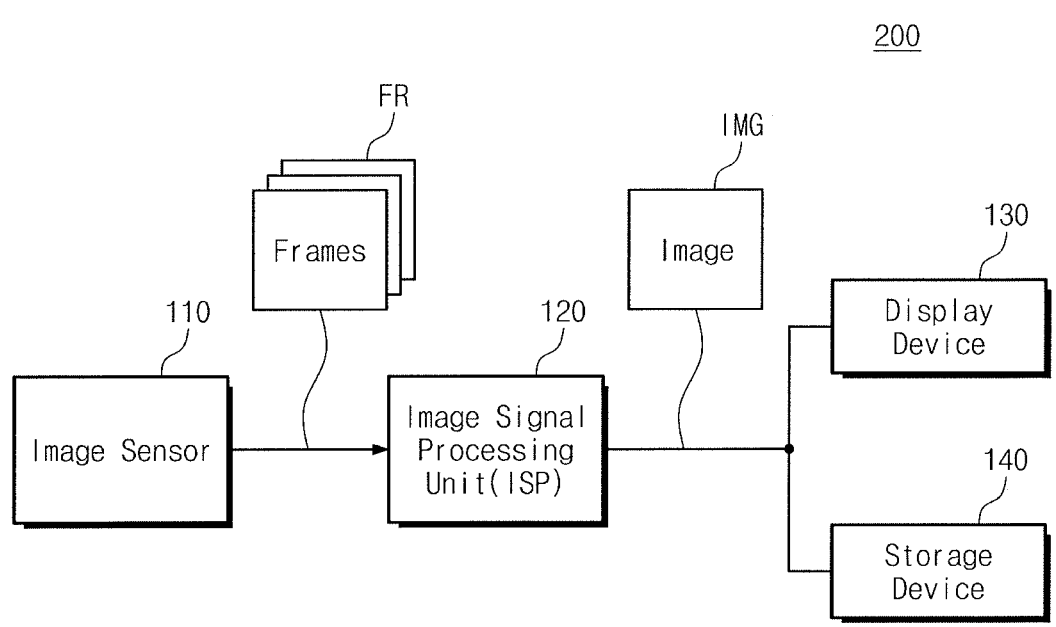
FIG. 1 illustrates a schematic block diagram showing an image processing apparatus according to an example embodiment.

FIG. 1 illustrates a schematic block diagram showing an image processing apparatus according to an example embodiment.

Referring to FIG. 1, an image processing apparatus 200 may include an image sensor 110, an image signal processing unit (ISP) 120, a display device 130, and a storage device 140.

The image processing apparatus 200 may be or include an electric device capturing external images, such as a smart phone or a digital camera.

The image sensor 110 may convert light from external objects into electrical signals or data signals. The image sensor 110 may include a plurality of pixels. Each of the plurality of pixels may receive light reflected from the external object, and may convert the received light into electrical image signals or photo signals.

The image signal processing unit 120 may process frame data FR (or image data or photo data) received from the image sensor 110 and may output corrected image data IMG. For example, the image signal processing unit 120 may generate the image data IMG by performing, on the received frame data FR, one or more signal processing operations such as color interpolation, color correction, gamma correction, color space conversion, and edge correction.

The display device 130 may output the image data IMG received from the image signal processing unit 120 so as to allow a user to view the image data IMG. For example, the display device 130 may include any of various display panels such as a liquid crystal display panel, an organic light emitting display panel, an electrophoretic display panel, and an electrowetting display panel. The display device 130 may use the display panel to output the image data IMG.

The storage device 140 may be configured to store the image data IMG received from the image signal processing unit 120. The storage device 140 may include a volatile memory device such as a static random access memory (SRAM), a dynamic random access memory (DRAM), and a synchronous dynamic random access memory (SDRA), or a non-volatile memory device such as a read-only memory (ROM), a programmable read-only memory (PROM), an electrically programmable read-only memory (EPROM), an electrically erasable and programmable read-only memory (EEPROM), a flash memory, a phase change random access memory (PRAM), a magnetic random access memory (MRAM), a resistive random access memory (RRAM), and a ferroelectric random access memory (FRAM).

Figure 2:
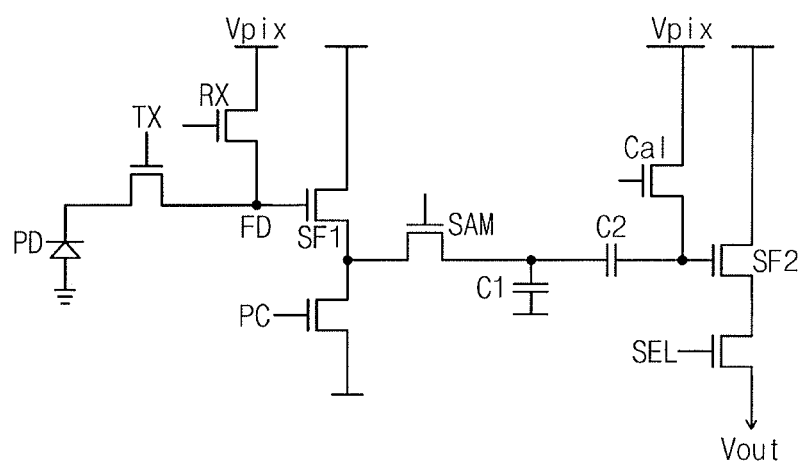
FIG. 2 illustrates a circuit diagram showing an image sensor according to an example embodiment.

The image sensor 110 according to the present example embodiment may include a capacitor that serves as a storage element capable of storing electrical signals caused by charges generated in a photoelectric conversion region. As an example, FIG. 2 shows a circuit diagram of an image sensor according to an example embodiment. Example embodiments also include other image sensors including capacitors.

FIG. 2 illustrates a circuit diagram showing an image sensor according to an example embodiment.

Referring to FIG. 2, an image sensor according to an example embodiment may have an in-pixel correlated double sampling (CDS) structure. For example, each unit pixel of the image sensor may include a photoelectric conversion region PD, a transfer transistor TX, a reset transistor RX, a first source follower transistor SF1, a pre-charge transistor PC, a sampling transistor SAM, a calibration transistor Cal, a second source follower transistor SF2, a selection transistor SEL, a first capacitor C1, and a second capacitor C2. The photoelectric conversion region PD may be a photodiode including an n-type impurity region and a p-type impurity region. The transfer transistor TX may have a first terminal connected to the photoelectric conversion region PD. The transfer transistor TX may also have a second terminal that serves as a floating diffusion region FD. The floating diffusion region FD may be connected to a first terminal of the reset transistor RX. The floating diffusion region FD may be electrically connected to a gate of the first source follower transistor SF1. The first source follower transistor SF1 may have a first terminal connected both to the pre-charge transistor PC and to the sampling transistor SAM. The sampling transistor SAM may have a first terminal connected to first electrodes of the first and second capacitors C1 and C2. The second capacitor C2 may have a second electrode connected both to a first terminal of the calibration transistor Cal and to a gate of the second source follower transistor SF2. The second source follower transistor SF2 may be connected to the selection transistor SEL.

The operation of the image sensor of FIG. 2 may have a step of sampling a reset value and a step of sampling a signal value. Before light accumulation, the floating diffusion region FD may reset the photoelectric conversion region PD. After the photoelectric conversion region PD is reset, the light accumulation (or frame capture) may start. After a duration of the light accumulation, the floating diffusion region FD may be reset to a power voltage Vpix. This stage could cause the reset value to have a noise component. The reset value having the noise component may be sampled to the first capacitor C1 and the second capacitor C2 through the first source follower transistor SF1 and the sampling transistor SAM. When the sampling step starts, the first and second capacitors C1 and C2 may be pre-charged to allow the first source follower transistor SF1 to sample a new voltage after removing previously sampled voltages of the first and second capacitors C1 and C2. This pre-charge operation may be performed using the pre-charge transistor PC. During the sampling step, the calibration transistor Cal may be off-state.

After the sampling step, charges may be transferred from the photoelectric conversion region PD to the floating diffusion region FD, and the floating diffusion region FD may have a new voltage (second voltage). The second voltage of the floating diffusion region FD may be sampled at the first capacitor C1 through the first source follower transistor SF1 and the sampling transistor SAM. As a result, the first capacitor C1 may have a voltage value, which is less than the reset value and thus becomes a new value resulting from the transferred amount of charges. In comparison to the reset sampling step, the second capacitor C2 may maintain its amount of charges because a right node of the second capacitor C2 may be floated during this sampling step. This tendency may indicate that a voltage at the right node of the second capacitor C2 may become lower than a corrected voltage (Vpix in this case) as much as a voltage drop at a left node of the second capacitor C2. When the reset noise is sampled during the reset sampling step, the right node of the second capacitor C2 may always be corrected into a fixed voltage (Vpix in this case), which may result in no noise component at the right node of the second capacitor C2. This result may mean that an output value Vout of a pixel may have no noise component, and that a CDS (corrected double sampling) operation may be effectively performed in the pixel. The image sensor having the structure mentioned above may have a reduced noise component and may be performed at high rates.

The image sensor according to an example embodiment may be operated in a global shutter mode. In the global shutter mode, electrical signals (data) generated from all of the pixels in the image sensor may be simultaneously sampled/stored at the first capacitors C1 and/or the second capacitors C2 included in the pixels, and the image signal processing unit 120 of FIG. 1 may sequentially read data for each row. Therefore, the global shutter mode may be accomplished. The image sensor according to the present example embodiment may thus be implemented as a voltage-based global shutter image sensor.

Figure 3:
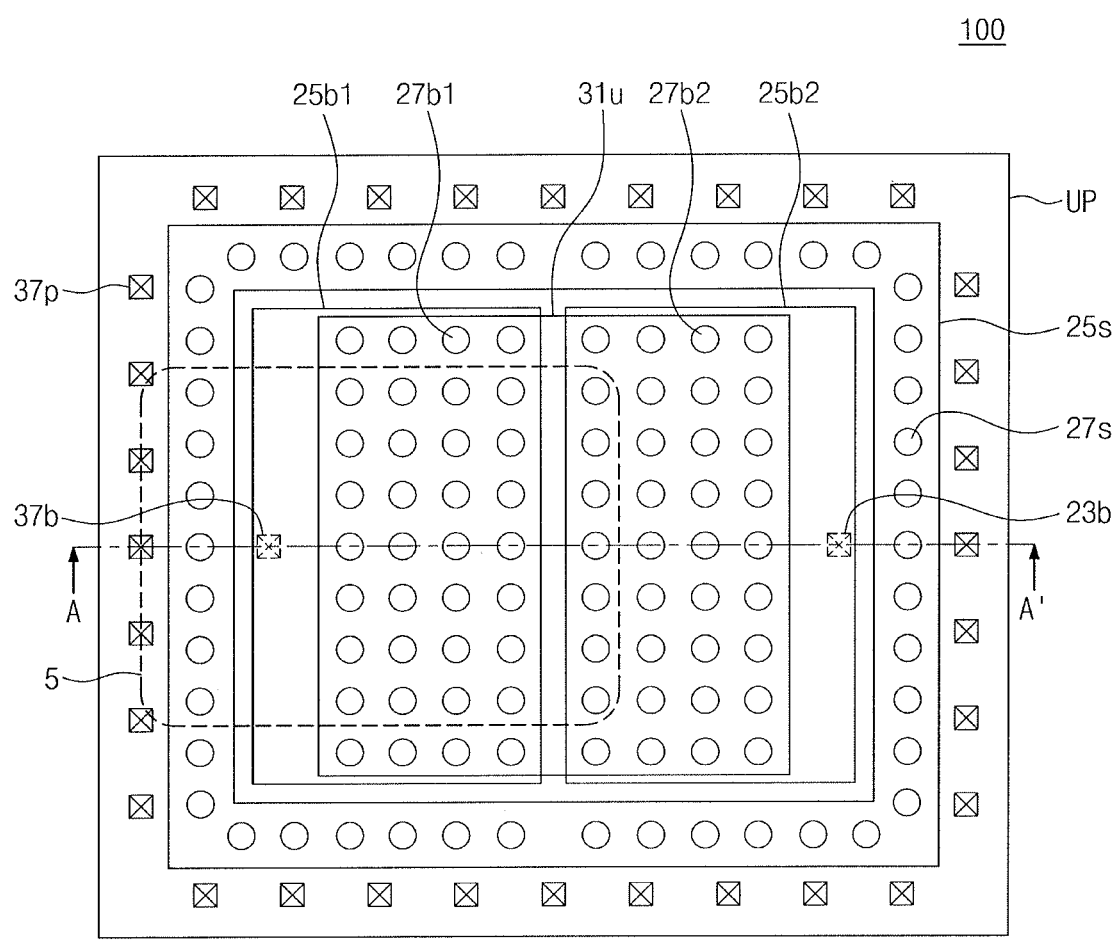
FIG. 3 illustrates a plan view showing an image sensor according to an example embodiment.
Figure 4:
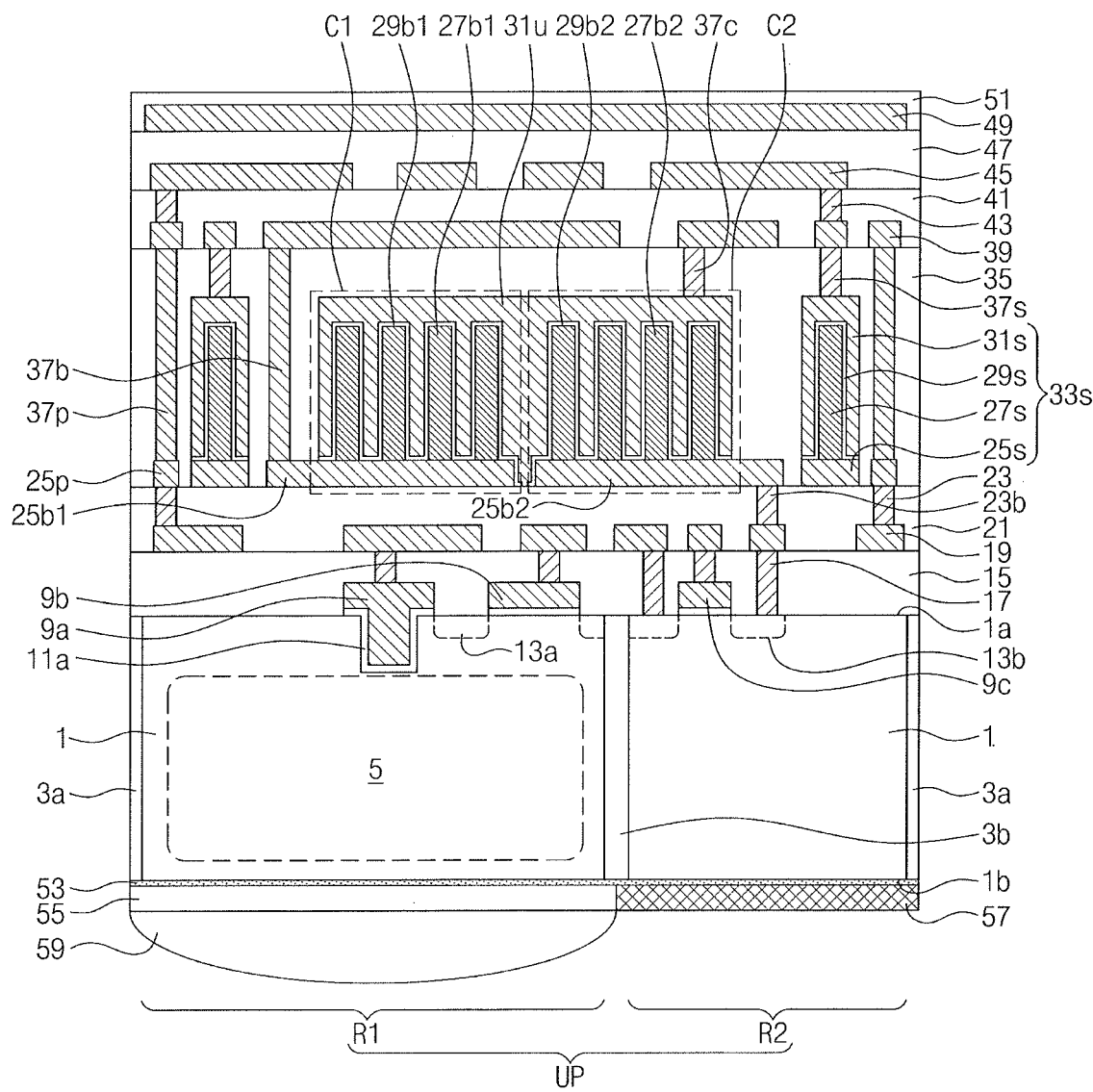
FIG. 4 illustrates a cross-sectional view taken along line A-A' of FIG. 3.

FIG. 3 illustrates a plan view showing an image sensor according to an example embodiment. FIG. 4 illustrates a cross-sectional view taken along line A-A' of FIG. 3.

Referring to FIGS. 3 and 4, an image sensor 100 according to an example embodiment may include a pixel array having a plurality of pixels UP. Only one pixel UP is illustrated for convenience of description.

The image sensor 100 may include a substrate 1. The substrate 1 may include, for example, a single crystalline silicon substrate or an epitaxial layer of a semiconductor material such as silicon. The substrate 1 may have a first surface 1*a* and a second surface 1*b* facing each other. A first deep device isolation layer 3*a* may be disposed in the substrate 1. The first deep device isolation layer 3*a* may have a mesh shape. A second deep device isolation layer 3*b* may be disposed in the substrate 1. As shown in FIG. 4, the second deep device isolation layer 3*b* may be spaced apart from the first deep device isolation layer 3*a*. In one pixel UP, the second deep device isolation layer 3*b* may divide the substrate 1 into a first region R1 and a second region R2. The first region R1 may be a light-receiving section. The second region R2 may be a circuit section. The first and second deep device isolation layers 3*a* and 3*b* may penetrate the substrate 1. The first and second deep device isolation layers 3*a* and 3b may include, for example, one or more of a silicon oxide layer, a silicon oxynitride layer, and a silicon nitride layer. The second deep device isolation layer 3b may have a structure that includes a heavily-doped impurity part of a first conductivity type and also includes a shallow device isolation part on the heavily-doped impurity part. The first conductivity type may be p-type.

The substrate 1 may be doped with impurities having, for example, the first conductivity type. A first impurity region 5 may be disposed in the substrate 1 of the first region R1. The first impurity region 5 may be doped with impurities having, for example, a second conductivity type opposite to the first conductivity type. The second conductivity type may be n-type. The first impurity region 5 and the substrate 1 therearound may constitute a PN junction to provide a photoelectric conversion region (see PD of FIG. 2). The first impurity region 5 may be a portion of the photoelectric conversion region PD. The first impurity region 5 may also be called the photoelectric conversion region PD.

The first region R1 may include a first gate electrode 9a and a second gate electrode 9b on the first surface 1a of the substrate 1. The second region R2 may include a third gate electrode 9c on the first surface 1a of the substrate 1. A gate dielectric layer 11a may be interposed between the substrate 1 and each of the first, second, and third gate electrodes 9a, 9b, and 9c. The first, second, and third gate electrodes 9a, 9b, and 9c may include, for example, one or more of impurity-doped polysilicon, metal silicide such as cobalt silicide, metal nitride such as titanium nitride, or metal such as tungsten, copper, or aluminum. The gate dielectric layer 11a may include, for example, one or more of a silicon oxide layer, a silicon nitride layer, a metal oxide layer, or a metal nitride layer. A portion of the first gate electrode 9a may extend into the substrate 1 and be adjacent to the first impurity region 5. A second impurity region 13a may be disposed in the substrate 1 between the first gate electrode 9a and the second gate electrode 9b. A third impurity region 13b may be disposed in the substrate 1 on opposite sides of the third gate electrode 9c. The second and third impurity regions 13a and 13b may all be doped with impurities having the second conductivity type. The second impurity region 13a may correspond to, for example, the floating diffusion region FD shown in FIG. 2.

The first gate electrode 9a may correspond to, for example, a gate of the transfer transistor TX shown in FIG. 2. The second gate electrode 9b may correspond to, for example, a gate of the reset transistor RX shown in FIG. 2. The third gate electrode 9c may correspond to, for example, a gate of the calibration transistor Cal shown in FIG. 2. In an implementation, the second region R2 may further include on the first surface 1a of the substrate 1 one or more of the first source follower transistor SF1, the sampling transistor SAM, the pre-charge transistor PC, the second source follower transistor SF2, and the selection transistor SEL that are shown in FIG. 2.

The substrate 1 may be covered with a first interlayer dielectric layer 15. First wiring lines 19 may be disposed on the first interlayer dielectric layer 15. The first interlayer dielectric layer 15 may be provided therein with first contact plugs 17 electrically connected to the first wiring lines 19. Some of the first contact plugs 17 may contact the first, second, and third gate electrodes 9a, 9b, and 9c. One of the first contact plugs 17 may contact the third impurity region 13b.

The first interlayer dielectric layer 15 may be provided thereon with a second interlayer dielectric layer 21 covering the first wiring lines 19. The second interlayer dielectric layer 21 may be provided therein with second contact plugs 23b and 23 that penetrate the second interlayer dielectric layer 21 and have electrical connection with the first wiring lines 19. The second contact plugs 23b and 23 may include a second bottom-electrode contact plug 23b and a second edge contact plug 23. The second bottom-electrode contact plug 23b may be electrically connected to the third impurity region 13b. The second interlayer dielectric layer 21 may be provided thereon with a first bottom electrode 25b1, a second bottom electrode 25b2, a dummy bottom electrode 25s, and edge conductive pads 25p, which components 25b1, 25b2, 25s, and 25p are spaced apart from each other. The first and second bottom electrodes 25b1 and 25b2 may have a plate shape on a central portion of the pixel UP. The dummy bottom electrode 25s may have a closed loop shape that surrounds the first and second bottom electrodes 25b1 and 25b2. The edge conductive pads 25p may have island shapes that are spaced apart from each other outside the dummy bottom electrode 25s and arranged to surround the dummy bottom electrode 25s. The first bottom electrode 25b1, the second bottom electrode 25b2, the dummy bottom electrode 25s, and the edge conductive pads 25p may all include the same material and may all be located at the same height. The first bottom electrode 25b1, the second bottom electrode 25b2, the dummy bottom electrode 25s, and the edge conductive pads 25p may include metal such as tungsten, copper, aluminum, titanium, or tantalum. The second bottom electrode 25b2 may contact the second bottom-electrode contact plug 23b. The edge conductive pad 25p may contact the second edge contact plug 23.

The first bottom electrode 25b1 may be provided thereon with a plurality of first conductive pillars 27b1 that are spaced apart from each other. The second bottom electrode 25b2 may be provided thereon with a plurality of second conductive pillars 27b2 that are spaced apart from each other. The dummy bottom electrode 25s may be provided thereon with a plurality of dummy conductive pillars 27s that are spaced apart from each other. As shown in FIG. 3, the dummy conductive pillars 27s may be disposed to surround the first and second bottom electrodes 25b1 and 25b2. The first conductive pillars 27b1, the second conductive pillars 27b2, and the dummy conductive pillars 27s may all include the same material and may all be located at the same height. The first conductive pillars 27b1, the second conductive pillars 27b2, and the dummy conductive pillars 27s may include, for example, impurity-doped polysilicon or metal such as tungsten, copper, aluminum, titanium, or tantalum.

A first dielectric layer 29b1 may cover top surfaces and sidewalls of the first conductive pillars 27b1 and a top surface of the first bottom electrode 25b1, which top surface is exposed between the first conductive pillars 27b1. A second dielectric layer 29b2 may cover top surfaces and sidewalls of the second conductive pillars 27b2 and a top surface of the second bottom electrode 25b2, which top surface is exposed between the second conductive pillars 27b2. A dummy dielectric layer 29s may cover top surfaces and sidewalls of the dummy conductive pillars 27s and a top surface of the dummy bottom electrode 25s, which top surface is exposed between the dummy conductive pillars 27s. The first, second, and dummy dielectric layers 29b1, 29b2, and 29s may be spaced apart from each other. The first, second, and dummy dielectric layers 29b1, 29b2, and 29s may have one of single-layered and multi-layered structures of the same material, for example, silicon oxide, tungsten oxide, copper oxide, aluminum oxide, titanium oxide, tantalum oxide, zirconium oxide, lanthanum oxide, or a combination thereof.

The first and second dielectric layers 29b1 and 29b2 may be covered with a top electrode 31u. The first dielectric layer 29b1 may separate the top electrode 31u from the first bottom electrode 25b1. The second dielectric layer 29b2 may separate the top electrode 31u from the second bottom electrode 25b2. The first bottom electrode 25b1, the first conductive pillars 27b1, the first dielectric layer 29b1, and a portion of the top electrode 31u may constitute a first capacitor C1. The second bottom electrode 25b2, the second conductive pillars 27b2, the second dielectric layer 29b2, and a portion of the top electrode 31u may constitute a second capacitor C2. The first and second capacitors C1 and C2 may share the top electrode 31u. The top electrode 31u may not cover but expose a portion of the first bottom electrode 25b1 and of the second bottom electrode 25b2.

The dummy dielectric layer 29s may be covered with a dummy top electrode 31s. When viewed in plan view, the dummy dielectric layer 29s and the dummy top electrode 31s may have a closed loop shape that surrounds the top electrode 31u. The dummy bottom electrode 25s, the dummy conductive pillars 27s, the dummy dielectric layer 29s, and the dummy top electrode 31s may constitute a shield structure 33s. The shield structure 33s may be supplied with a ground voltage. The ground voltage may be applied to one or more of the dummy top electrode 31s and the dummy bottom electrode 25s of the shield structure 33s.

The top electrode 31u and the dummy top electrode 31s may include the same material and be located at the same height. The top electrode 31u and the dummy top electrode 31s may include, for example, impurity-doped polysilicon, silicon germanium, and/or metal such as tungsten, copper, aluminum, titanium, or tantalum.

The shield structure 33s may have a bottom surface at the same height as that of bottom surfaces of the first and second capacitors C1 and C2, and also have a top surface at the same height as that of top surfaces of the first and second capacitors C1 and C2.

According to the present example embodiment, the image sensor 100 includes the shield structure 33s that surrounds the first and second capacitors C1 and C2. Thus, a parasitic capacitance may be prevented or minimized between conductive lines (e.g., the third edge contact plug 37p) adjacent to the first and second capacitors C1 and C2, which may result in a reduction in coupling noise. The image sensor 100 may thus produce a sharp image.

The second interlayer dielectric layer 21 may be provided thereon with a third interlayer dielectric layer 35 covering the top electrode 31u and the dummy top electrode 31s. A top-electrode contact plug 37c may penetrate the third interlayer dielectric layer 35 and have contact with the top electrode 31u. The top-electrode contact plug 37c may be electrically connected to the first terminal of the sampling transistor SAM shown in FIG. 2. A dummy top-electrode contact plug 37s may penetrate the third interlayer dielectric layer 35 and have contact with the dummy top electrode 31s. A first bottom-electrode contact plug 37b may penetrate the third interlayer dielectric layer 35 and have contact with the first bottom electrode 25b1. A third edge contact plug 37p may penetrate the third interlayer dielectric layer 35 and have contact with the edge conductive pad 25p. The first bottom-electrode contact plug 37b may have a vertical length the same as that of the third edge contact plug 37p.

Third wiring lines 39 may be disposed on the third interlayer dielectric layer 35. The third interlayer dielectric layer 35 may be provided thereon with a fourth interlayer dielectric layer 41 covering the third wiring lines 39. Fourth contact plugs 43 may penetrate the fourth interlayer dielectric layer 41 and have electrical connection with the third wiring lines 39. Fourth wiring lines 45 may be disposed on the fourth interlayer dielectric layer 41. The fourth wiring lines 45 may be covered with a fifth interlayer dielectric layer 47. The first, second, third, fourth, and fifth interlayer dielectric layers 15, 21, 35, 41, and 47 may include, for example, one or more of a silicon oxide layer, a silicon nitride layer, a silicon oxynitride layer, or a porous dielectric layer.

An upper metal plate 49 may be disposed on the fifth interlayer dielectric layer 47. The upper metal plate 49 may include a metallic material such as tungsten or copper. The fifth interlayer dielectric layer 47 may be provided thereon with a passivation layer 51 covering the upper metal plate 49. The passivation layer 51 may be formed of, for example, silicon nitride or polyimide. The upper metal plate 49 may occupy most of an area of one pixel UP. The upper metal plate 49 may shield the image sensor 100 against an external electric field. The upper metal plate 49 may prevent the substrate 1 from having incident thereon light from outside the passivation layer 51. When light is directed into the image sensor 100 through the second surface 1b of the substrate 1 and then directed out of the image sensor 100 through the first, second, third, fourth, and fifth interlayer dielectric layers 15, 21, 35, 41, and 47, the upper metal plate 49 may serve as a reflector that enables the light to reflect and travel back to the first impurity region 5.

The first region R1 may include a micro-lens 59 adjacent to the second surface 1b of the substrate 1. A color filter 55 may be interposed between the micro-lens 59 and the second surface 1b of the substrate 1. The second region R2 may include a second metal plate 57 adjacent to the second surface 1b of the substrate 1. The second metal plate 57 may include metal such as tungsten, aluminum, and copper. The second metal plate 57 may serve as a light-shield pattern that prevents light from being incident into the substrate 1 of the second region R2.

A fixed charge layer 53 may be interposed between the color filter 55 and the second surface 1b of the substrate 1 and between the second metal plate 57 and the second surface 1b of the substrate 1. The second surface 1b of the substrate 1 may contact the fixed charge layer 53. The fixed charge layer 53 may have, for example, a metal oxide layer that includes oxygen whose amount is less than its stoichiometric ratio or a metal fluoride layer that includes fluorine whose amount is less than its stoichiometric ratio. The fixed charge layer 53 may thus have a negative fixed charge. The fixed charge layer 53 may include or consist of metal oxide or metal fluoride that includes at least one metal selected from the group of hafnium (Hf), zirconium (Zr), aluminum (Al), tantalum (Ta), titanium (Ti), yttrium (Y), and lanthanides. For example, the fixed charge layer 53 may be a hafnium oxide layer or an aluminum fluoride layer. The fixed charge layer 53 may cause hole accumulation around the second surface 1b. Therefore, dark current and white spots may be effectively reduced.

FIGS. 5 to 9 illustrate cross-sectional views showing a method of fabricating an image sensor having the cross-section of FIG. 4.

Figure 5:
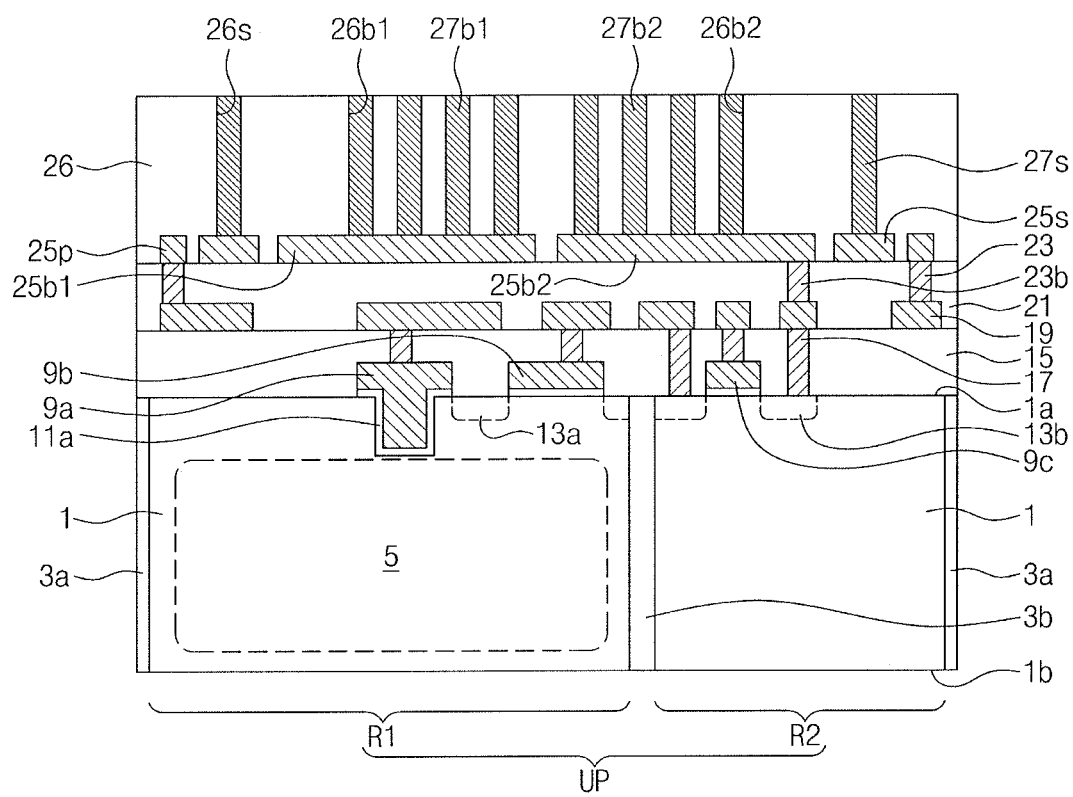
FIGS. 5 to 9 illustrate cross-sectional views showing a method of fabricating an image sensor having the cross-section of FIG. 4.

Referring to FIG. 5, impurities of a first conductivity type may be doped into a substrate 1 having a first surface 1a and a second surface 1b facing each other. The first conductivity type may be, for example, p-type. A first deep device isolation layer 3a may be formed in the substrate 1, partitioning pixels UP. A second deep device isolation layer 3b may also be formed to divide the substrate 1 into a first region R1 and a second region R2. Impurities of a second conductivity type may be doped into the substrate 1 of the first region R1, forming a first impurity region 5. The second conductivity type may be, for example, n-type. First, second, and third gate electrodes 9a, 9b, and 9c and a gate dielectric layer 11a may be formed on the first surface 1a of the substrate 1. Second and third impurity regions 13a and 13b may be formed in the substrate 1 on sides of the first, second, and third gate electrodes 9a, 9b, and 9c. A first interlayer dielectric layer 15, first contact plugs 17, first wiring lines 19, a second interlayer dielectric layer 21, a second bottom-electrode contact plug 23b, and a second edge contact plug 23 may be sequentially formed on the first surface 1a of the substrate 1.

A conductive layer may be formed on the second interlayer dielectric layer 21 and then patterned to form a first bottom electrode 25b1, a second bottom electrode 25b2, a dummy bottom electrode 25s, and edge conductive pads 25p, which components 25b1, 25b2, 25s, and 25p are spaced apart from each other. A mold layer 26 may be formed on the second interlayer dielectric layer 21, covering the first bottom electrode 25b1, the second bottom electrode 25b2, the dummy bottom electrode 25s, and the edge conductive pads 25p. In an implementation, before the mold layer 26 is formed, an etch stop layer (see 61 of FIG. 12) may be conformally formed. The mold layer 26 may include, for example, one or more of a silicon oxide layer, a silicon nitride layer, or a silicon oxynitride layer. The mold layer 26 may be patterned to form a plurality of first pillar holes 26b1 that expose a top surface of the first bottom electrode 25b1, a plurality of second pillar holes 26b2 that expose a top surface of the second bottom electrode 25b2, and a plurality of dummy pillar holes 26s that expose a top surface of the dummy bottom electrode 25s. A conductive layer may be stacked to fill the first, second, and dummy pillar holes 26b1, 26b2, and 26s, and then flat etched to faun first conductive pillars 27b1, second conductive pillars 27b2, and dummy conductive pillars 27s respectively in the first pillar holes 26b1, the second pillar holes 26b2, and the dummy pillar holes 26s.

Figure 6:
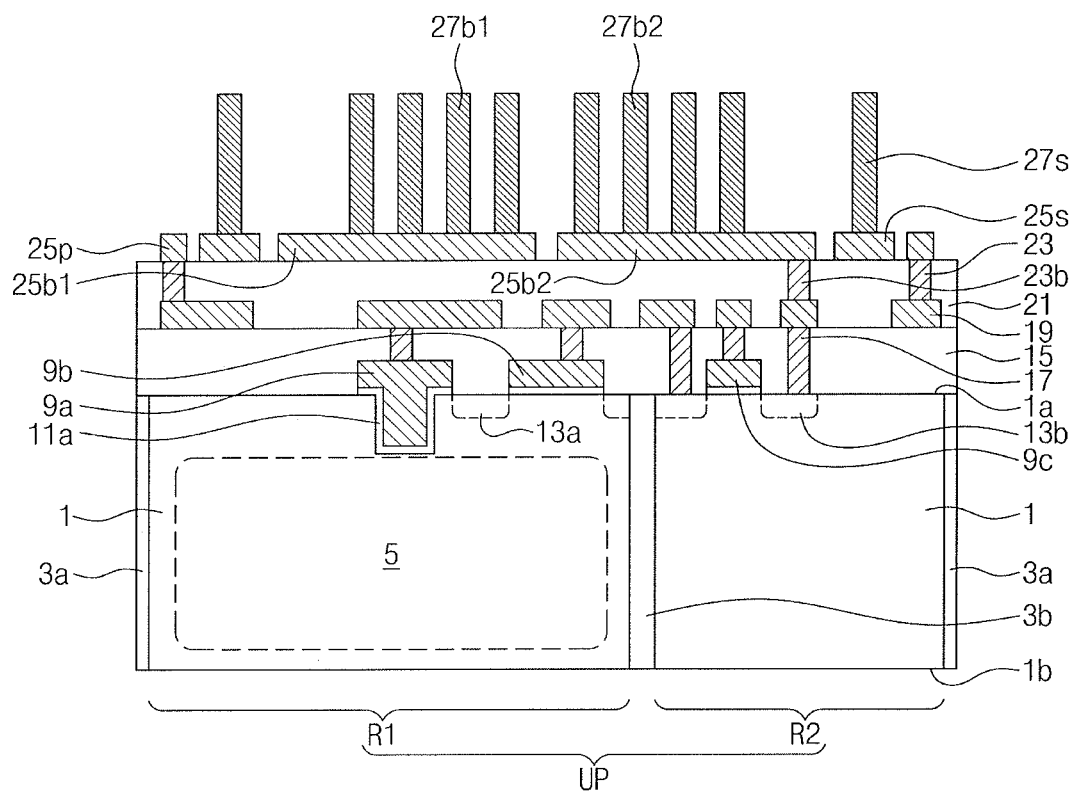

Referring to FIG. 6, the mold layer 26 may be removed to expose the first conductive pillars 27b1, the second conductive pillars 27b2, the dummy conductive pillars 27s, the first bottom electrode 25b1, the second bottom electrode 25b2, the dummy bottom electrode 25s, and the edge conductive pads 25p.

Figure 7:
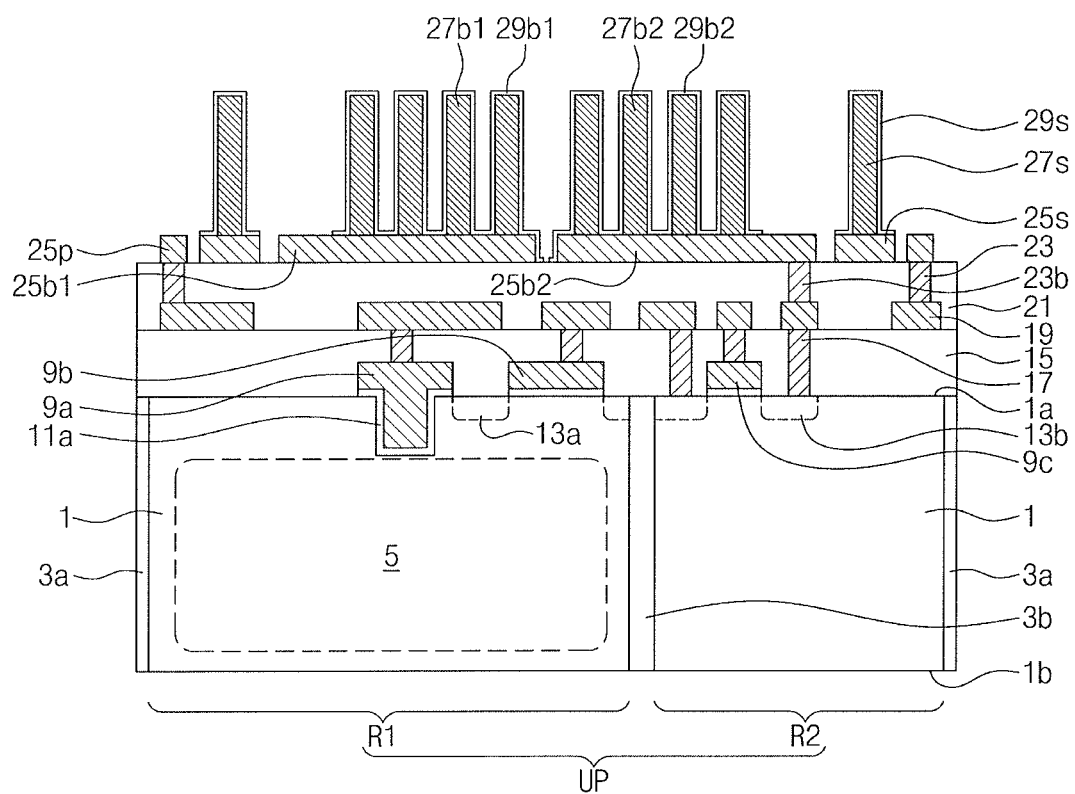

Referring to FIG. 7, a preliminary dielectric layer may be conformally formed on the second interlayer dielectric layer 21 and then patterned to form a first dielectric layer 29b1 that covers the first conductive pillars 27b1 and the first bottom electrode 25b1, a second dielectric layer 29b2 that covers the second conductive pillars 27b2 and the second bottom electrode 25b2, and a dummy dielectric layer 29s that covers the dummy conductive pillars 27s and the dummy bottom electrode 25s. At this time, the edge conductive pad 25p may be exposed at a top surface and a sidewall thereof.

Figure 8:
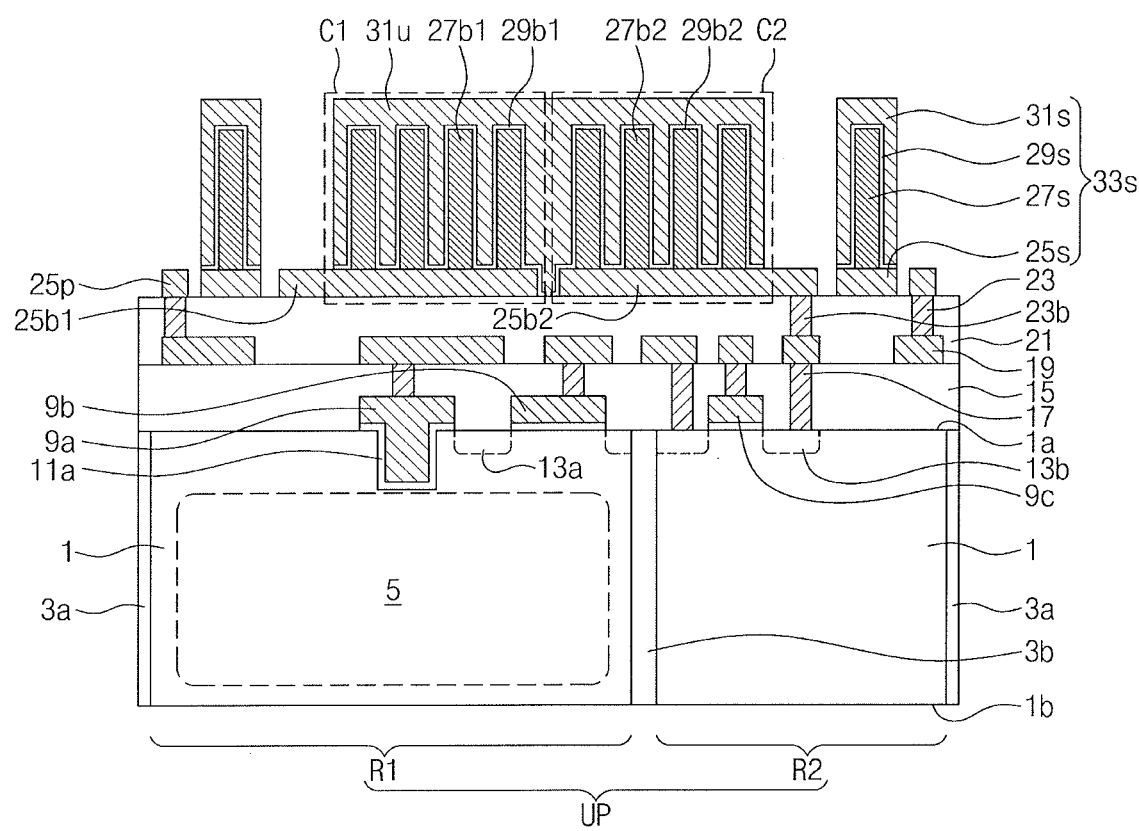

Referring to FIG. 8, a conductive layer may be stacked on the second interlayer dielectric layer 21 and then patterned to form a top electrode 31u and a dummy top electrode 31s. At this time, the edge conductive pad 25p may still be exposed at the top surface and the sidewall thereof. In addition, one or more of the first and second bottom electrodes 25b1 and 25b2 may be partially exposed at top surfaces thereof. The aforementioned processes may form a first capacitor C1, a second capacitor C2, and a shield structure 33s.

Figure 9:
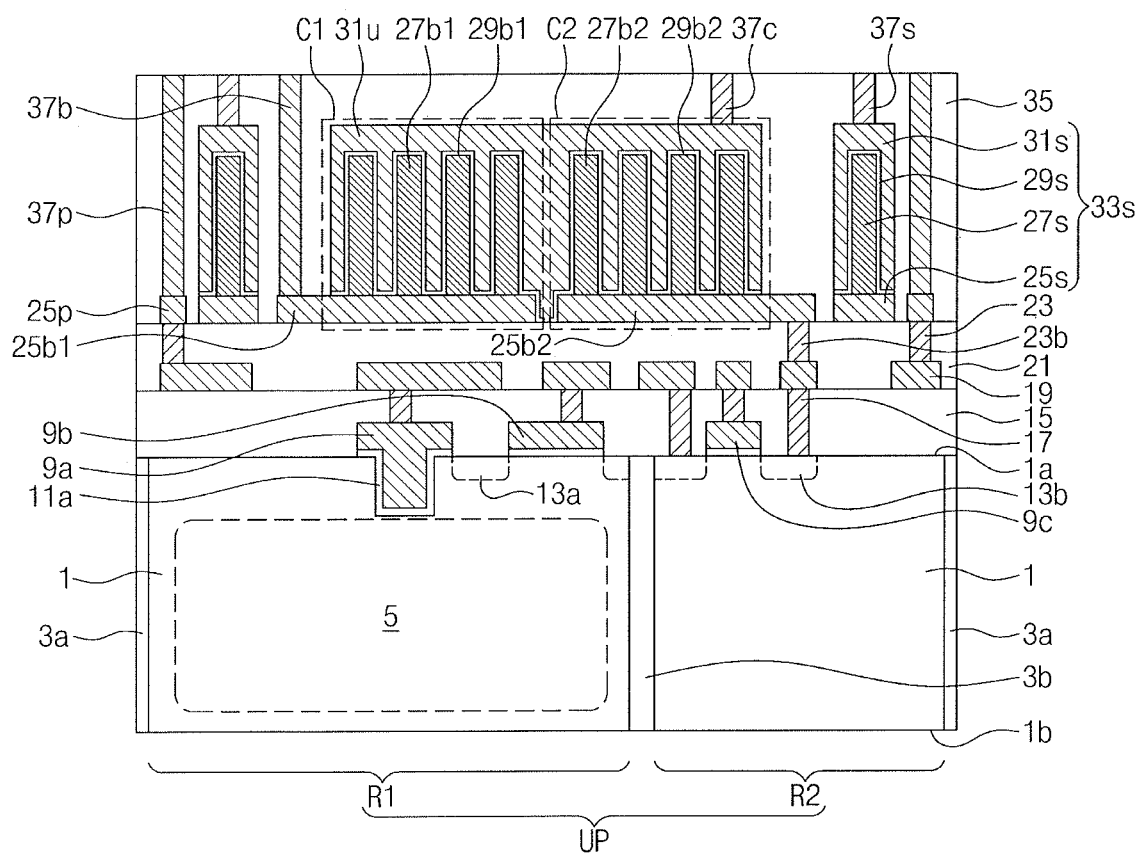

Referring to FIG. 9, a third interlayer dielectric layer 35 may be formed on the second interlayer dielectric layer 21, covering the first capacitor C1, the second capacitor C2, and the shield structure 33s. The third interlayer dielectric layer 35 may be patterned to form a plurality of contact pillar holes and then the contact pillar holes may be filled with a conductive layer to form a top-electrode contact plug 37c, a first bottom-electrode contact plug 37b, a dummy top-electrode contact plug 37s, and a third edge contact plug 37p. Subsequent processes may be performed to fabricate an image sensor 100 shown in FIG. 4.

Figure 10:
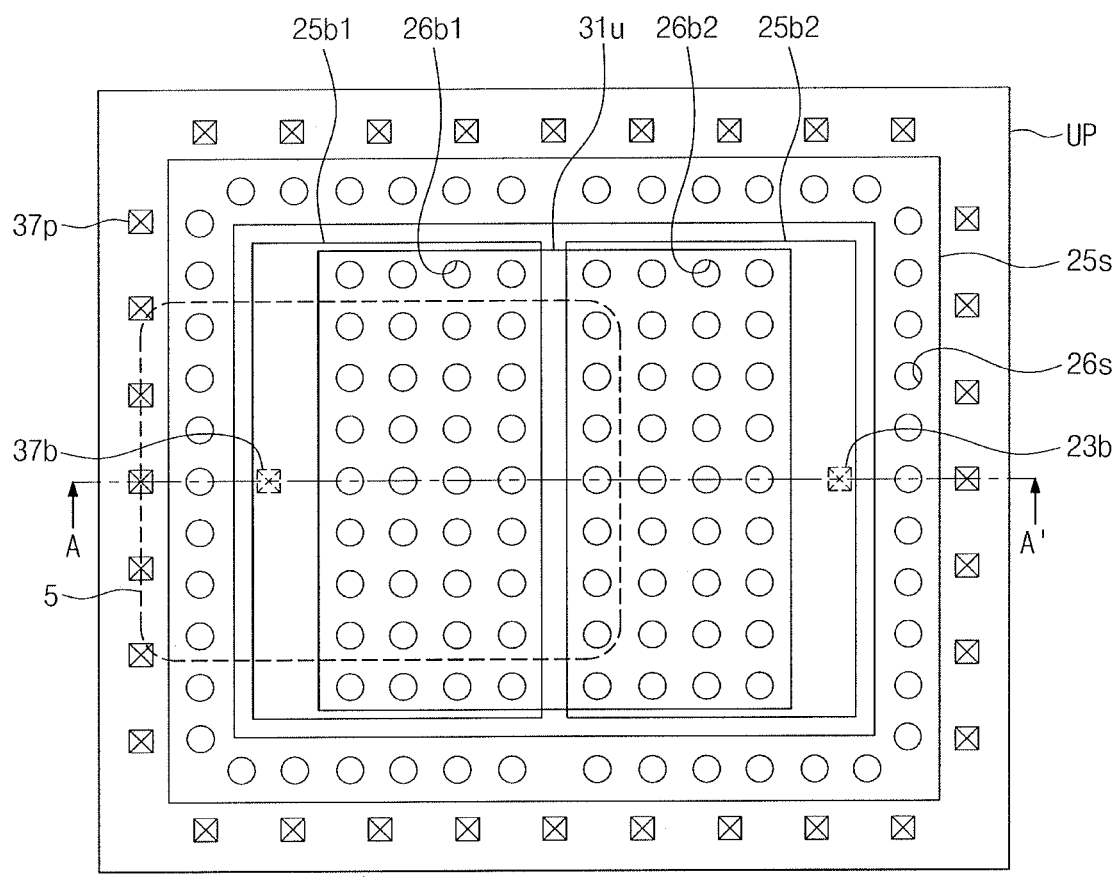
FIG. 10 illustrates a plan view showing an image sensor according to an example embodiment.
Figure 11:
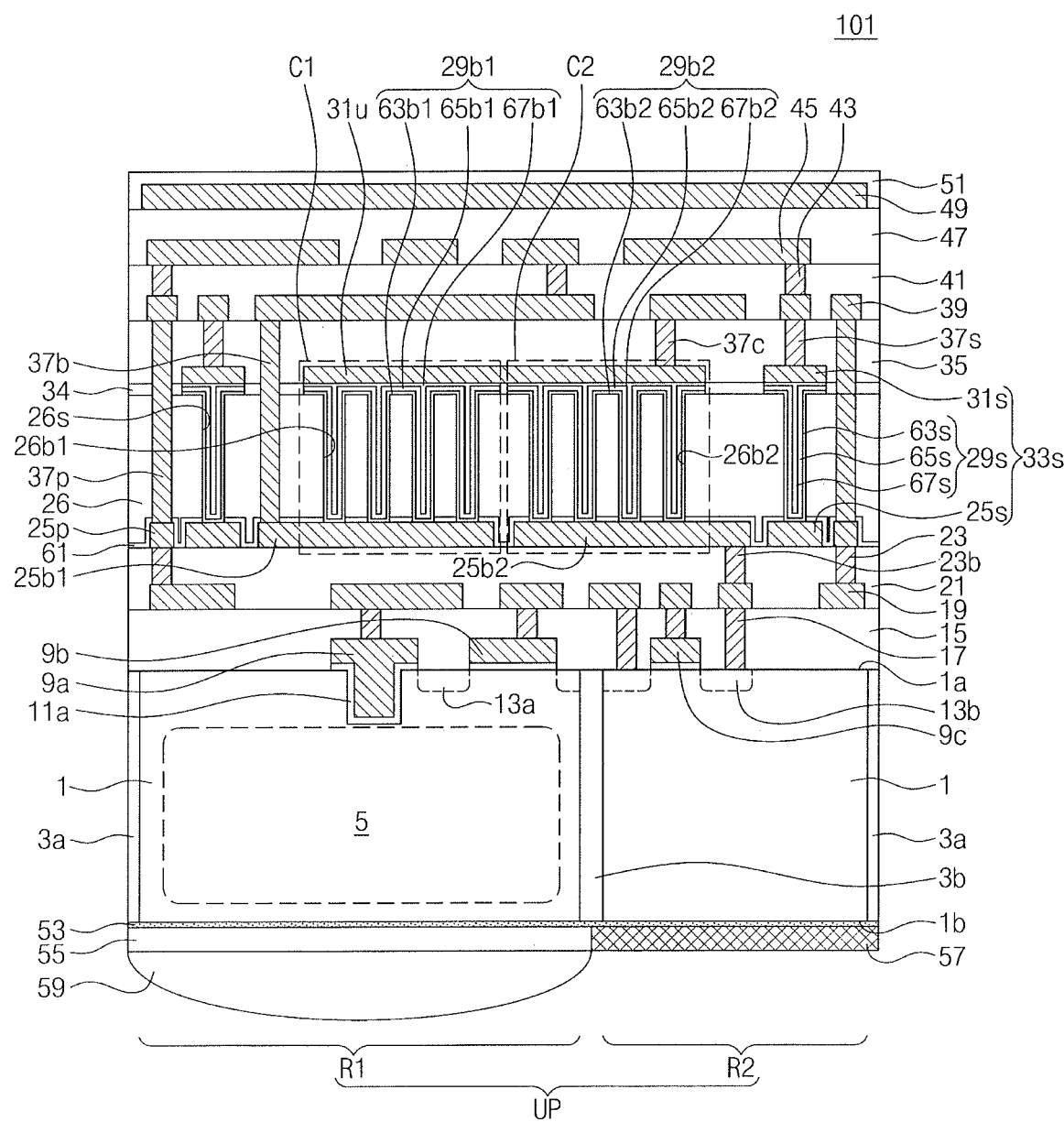
FIG. 11 illustrates a cross-sectional view taken along line A-A' of FIG. 10.

FIG. 10 illustrates a plan view showing an image sensor according to an example embodiment. FIG. 11 illustrates a cross-sectional view taken along line A-A' of FIG. 10.

Referring to FIGS. 10 and 11, an image sensor 101 according to an example embodiment may include none of the first conductive pillars 27b1, the second conductive pillars 27b2, and the dummy conductive pillars 27s. The first bottom electrode 25b1, the second bottom electrode 25b2, the dummy bottom electrode 25s, and the edge conductive pads 25p may be conformally covered with an etch stop layer 61. The mold layer 26 may be interposed between the etch stop layer 61 and each of the first, second, and dummy dielectric layers 29b1, 29b2, and 29s. The mold layer 26 may include a plurality of first pillar holes 26b1 that expose a top surface of the first bottom electrode 25b1, a plurality of second pillar holes 26b2 that expose a top surface of the second bottom electrode 25b2, and a plurality of dummy pillar holes 26s that expose a top surface of the dummy bottom electrode 25s. The first dielectric layer 29b1, the second dielectric layer 29b2, and the dummy dielectric layer 29s may extend respectively into the first pillar holes 26b1, the second pillar holes 26b2, and the dummy pillar holes 26s, and thus have contact respectively with the first bottom electrode 25b1, the second bottom electrode 25b2, and the dummy bottom electrode 25s.

The first, second, and dummy dielectric layers 29b1, 29b2, and 29s may all include a plurality of dielectric layers. For example, the first dielectric layer 29b1 may include a first lower dielectric layer 63b1, a first intermediate dielectric layer 65b1, and a first upper dielectric layer 67b1. The second dielectric layer 29b2 may include a second lower dielectric layer 63b2, a second intermediate dielectric layer 65b2, and a second upper dielectric layer 67b2. The dummy dielectric layer 29s may include a dummy lower dielectric layer 63s, a dummy intermediate dielectric layer 65s, and a dummy upper dielectric layer 67s. The lower dielectric layers 63b1, 63b2, and 63s, the intermediate dielectric layers 65b1, 65b2, and 65s, and the upper dielectric layers 67b1, 67b2, and 67s may include different materials from each other. In another example embodiment, the lower dielectric layers 63b1, 63b2, and 63s and the upper dielectric layers 67b1, 67b2, and 67s may include a different material from that of the intermediate dielectric layers 65b1, 65b2, and 65s. For example, the lower dielectric layers 63b1, 63b2, and 63s may include an aluminum oxide layer, the upper dielectric layers 67b1, 67b2, and 67s may include a zirconium oxide layer, and the intermediate dielectric layers 65b1, 65b2, and 65s may include a silicon oxide layer.

The first, second, and dummy dielectric layers 29b1, 29b2, and 29s may be spaced apart from each other. An auxiliary dielectric layer 34 may be disposed on the mold layer 26. The auxiliary dielectric layer 34 may be interposed between the first and second dielectric layers 29b1 and 29b2, between the first and dummy dielectric layers 29b1 and 29s, and between the second and dummy dielectric layers 29b2 and 29s. The auxiliary dielectric layer 34 may include a different material from that of at least the lower and upper dielectric layers 63b1, 63b2, 63s, 67b1, 67b2, and 67s.

The third edge contact plug 37p may penetrate the third interlayer dielectric layer 35, the auxiliary dielectric layer 34, the mold layer 26, and the etch stop layer 61, electrically connecting the edge conductive pad 25p to one of the third wiring lines 39. Other configurations may be identical or similar to those discussed above with reference to FIG. 4.

Figure 12:
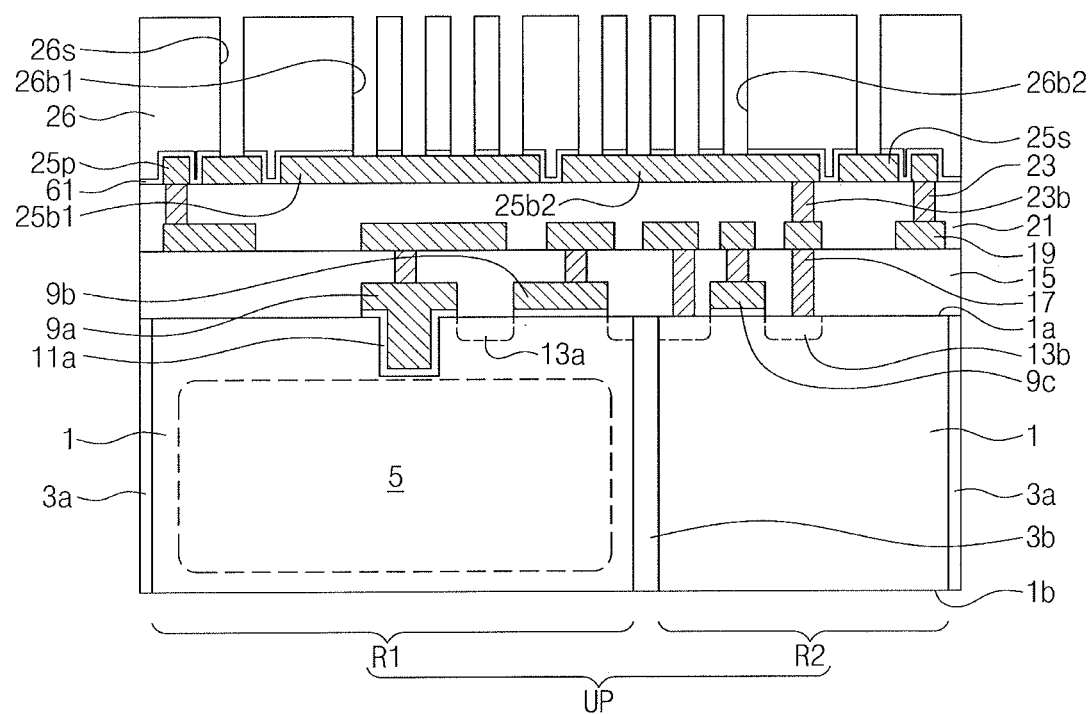
FIGS. 12 to 14 illustrate cross-sectional views showing a method of fabricating an image sensor having the cross-section of FIG. 11.
Figure 13:
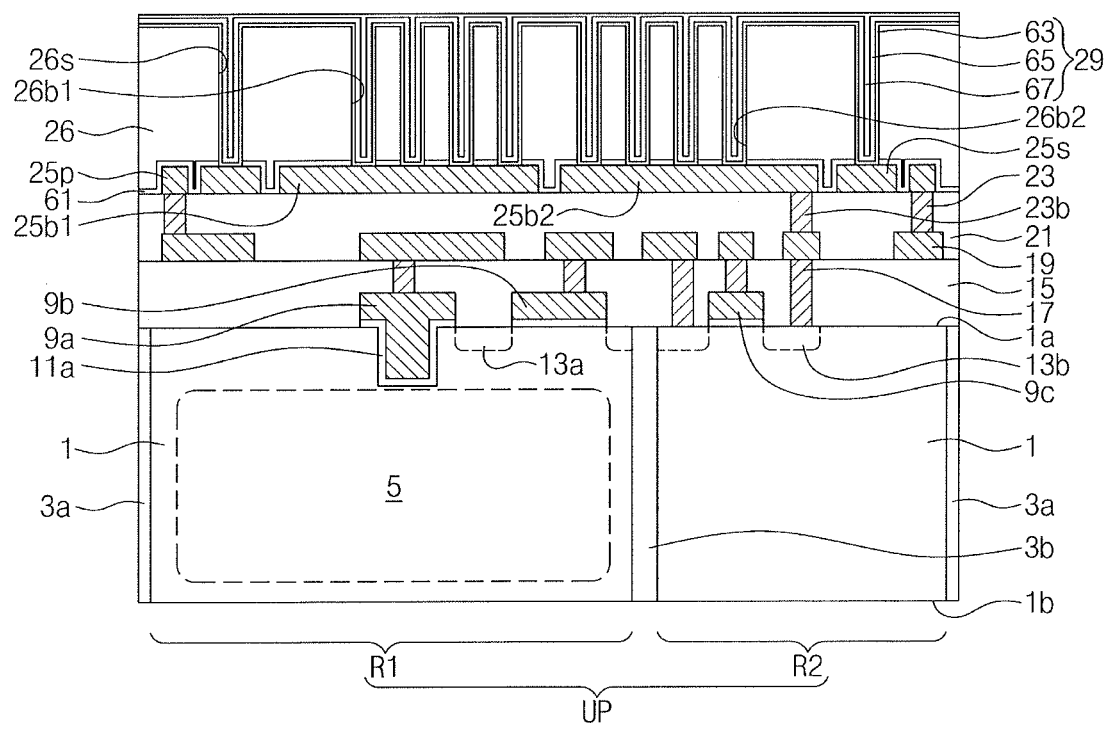
Figure 14:
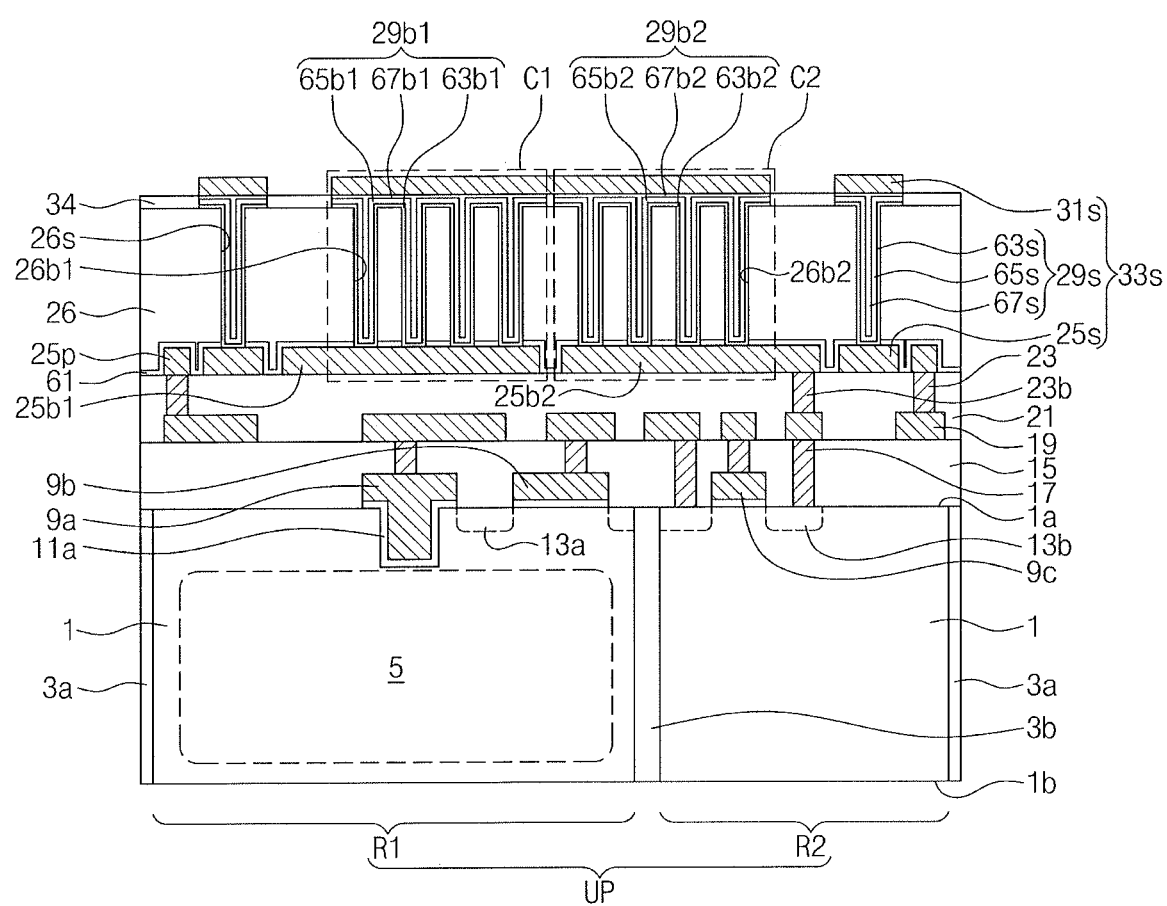

FIGS. 12 to 14 illustrate cross-sectional views showing a method of fabricating an image sensor shown in FIG. 11.

Referring to FIG. 12, the first bottom electrode 25b1, the second bottom electrode 25b2, the dummy bottom electrode 25s, and the edge conductive pads 25p may be formed on the second interlayer dielectric layer 21, and then the etch stop layer 61 may be conformally formed. The etch stop layer 61 may be formed of a material having an etch selectivity with respect to the second interlayer dielectric layer 21. For example, the etch stop layer 61 may be formed of a silicon nitride layer. The mold layer 26 may be formed on the etch stop layer 61. The mold layer 26 and the etch stop layer 61 may be sequentially patterned to form a plurality of first pillar holes 26b1 that expose a top surface of the first bottom electrode 25b1, a plurality of second pillar holes 26b2 that expose a top surface of the second bottom electrode 25b2, and a plurality of dummy pillar holes 26s that expose a top surface of the dummy bottom electrode 25s.

Referring to FIG. 13, a preliminary dielectric layer 29 may be stacked on the mold layer 26, filling the first, second, and dummy pillar holes 26b1, 26b2, and 26s. The preliminary dielectric layer 29 may be formed by sequentially stacking a lower dielectric layer 63, an intermediate dielectric layer 65, and an upper dielectric layer 67.

Referring to FIG. 14, the preliminary dielectric layer 29 may be patterned to form the first, second, and dummy dielectric layers 29b1, 29b2, and 29s and to expose a top surface of the mold layer 26. The auxiliary dielectric layer 34 may be formed on the exposed mold layer 26. A conductive layer may be stacked on the auxiliary dielectric layer 34 and then patterned to form the top electrode 31u and the dummy top electrode 31s. The aforementioned processes may form the first capacitor C1, the second capacitor C2, and the shield structure 33s. Subsequent processes may be performed to fabricate an image sensor 101 shown in FIG. 11.

Figure 15:
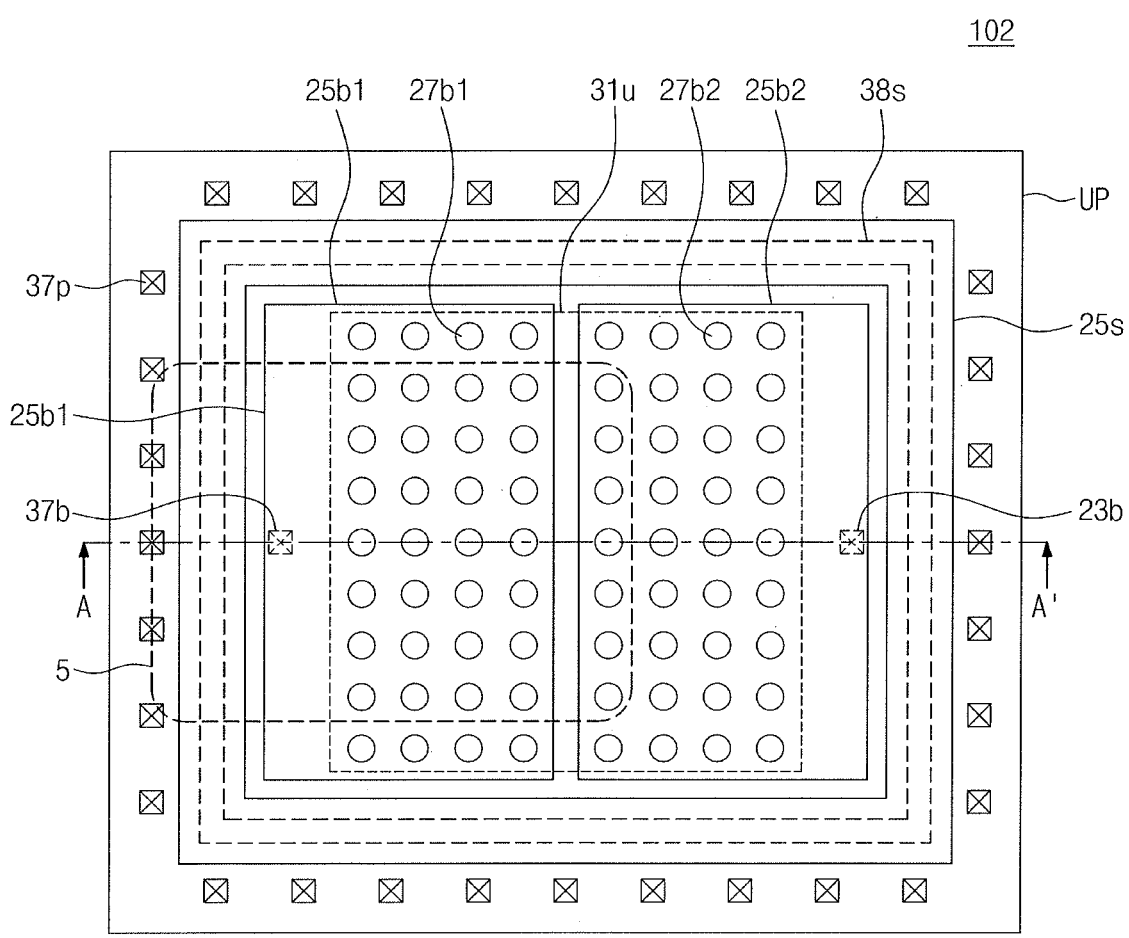
FIG. 15 illustrates a plan view showing an image sensor according to an example embodiment.
Figure 16:
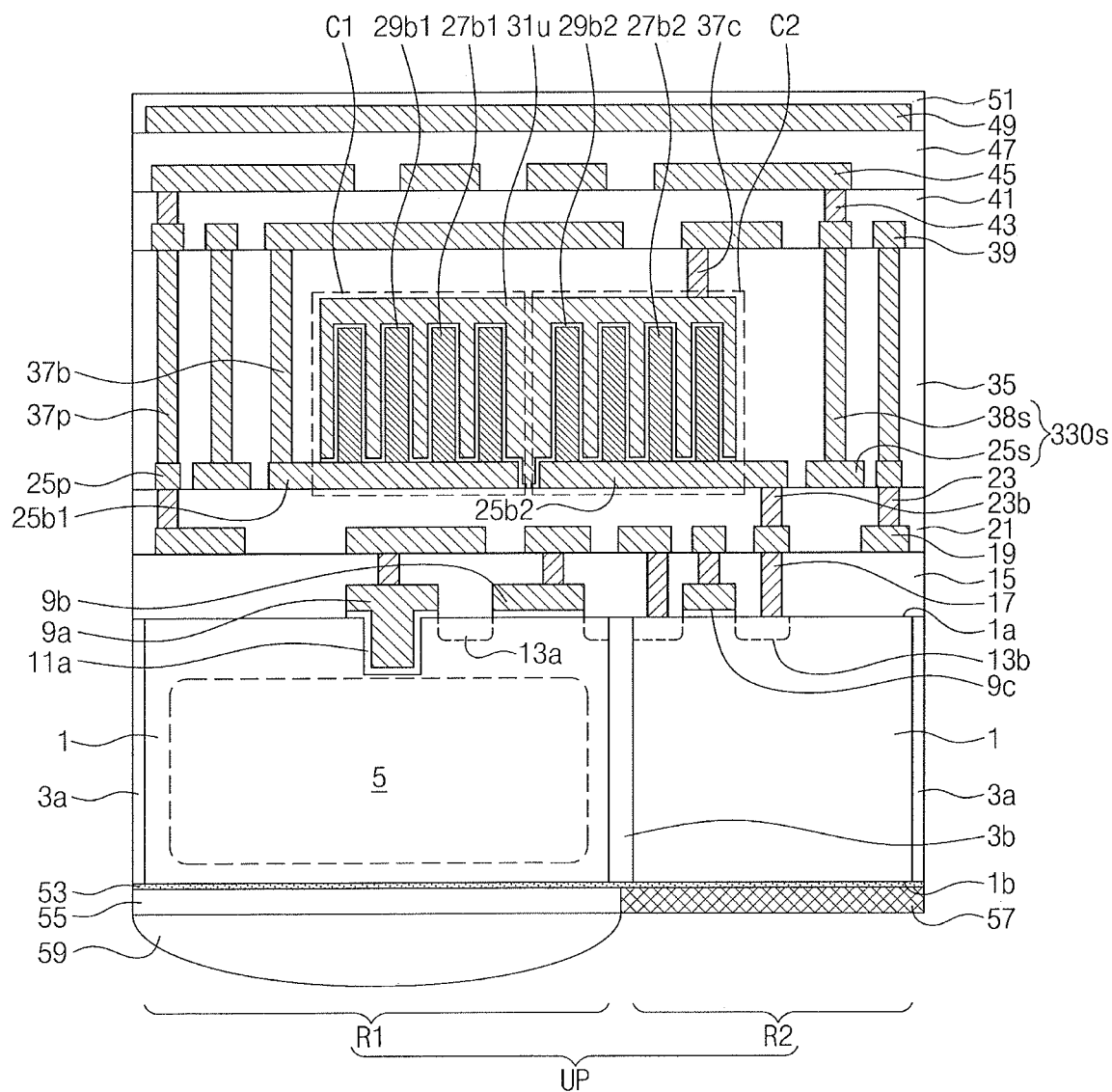
FIG. 16 illustrates a cross-sectional view taken along line A-A' of FIG. 15.

FIG. 15 illustrates a plan view showing an image sensor according to an example embodiment. FIG. 16 illustrates a cross-sectional view taken along line A-A' of FIG. 15.

Referring to FIGS. 15 and 16, an image sensor 102 according to an example embodiment may include a shield structure 330s whose structure is different from that of the shield structure 33s included in the image sensor 100 of FIG. 4. The shield structure 330s may have a bottom surface at the same height as that of bottom surfaces of the first and second capacitors C1 and C2, and also have a top surface at a greater height as that of top surfaces of the first and second capacitors C1 and C2. The dummy bottom electrode 25s and a shield pattern 38s on the dummy bottom electrode 25s may constitute the shield structure 330s. The shield pattern 38s may penetrate the third interlayer dielectric layer 35, connecting the dummy bottom electrode 25s to one of the third wiring lines 39. The shield pattern 38s may have a cross-sectional width less than that of the dummy bottom electrode 25s. The shield pattern 38s may have a closed loop shape that surrounds the first and second capacitors C1 and C2.

The shield pattern 38s may include the same material as that of the third edge contact plug 37p, may be located at the same height as that of the third edge contact plug 37p, and may have the same vertical length as that of the third edge contact plug 37p. The shield pattern 38s and the third edge contact plug 37p may be formed at the same time. The shield structure 330s may be supplied with a ground voltage. Other configurations and fabrication processes may be identical or similar to those discussed with reference to FIGS. 4 to 9.

Figure 17:
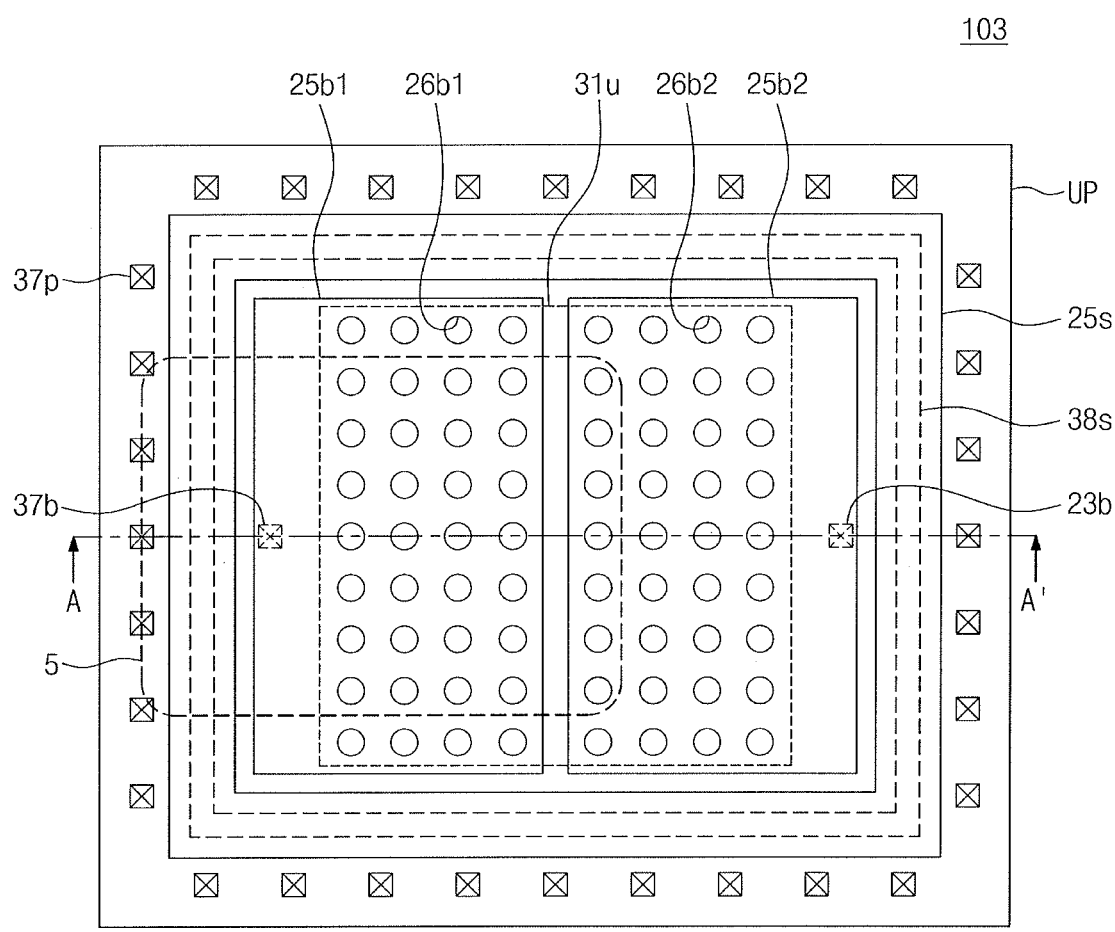
FIG. 17 illustrates a plan view showing an image sensor according to an example embodiment.
Figure 18:
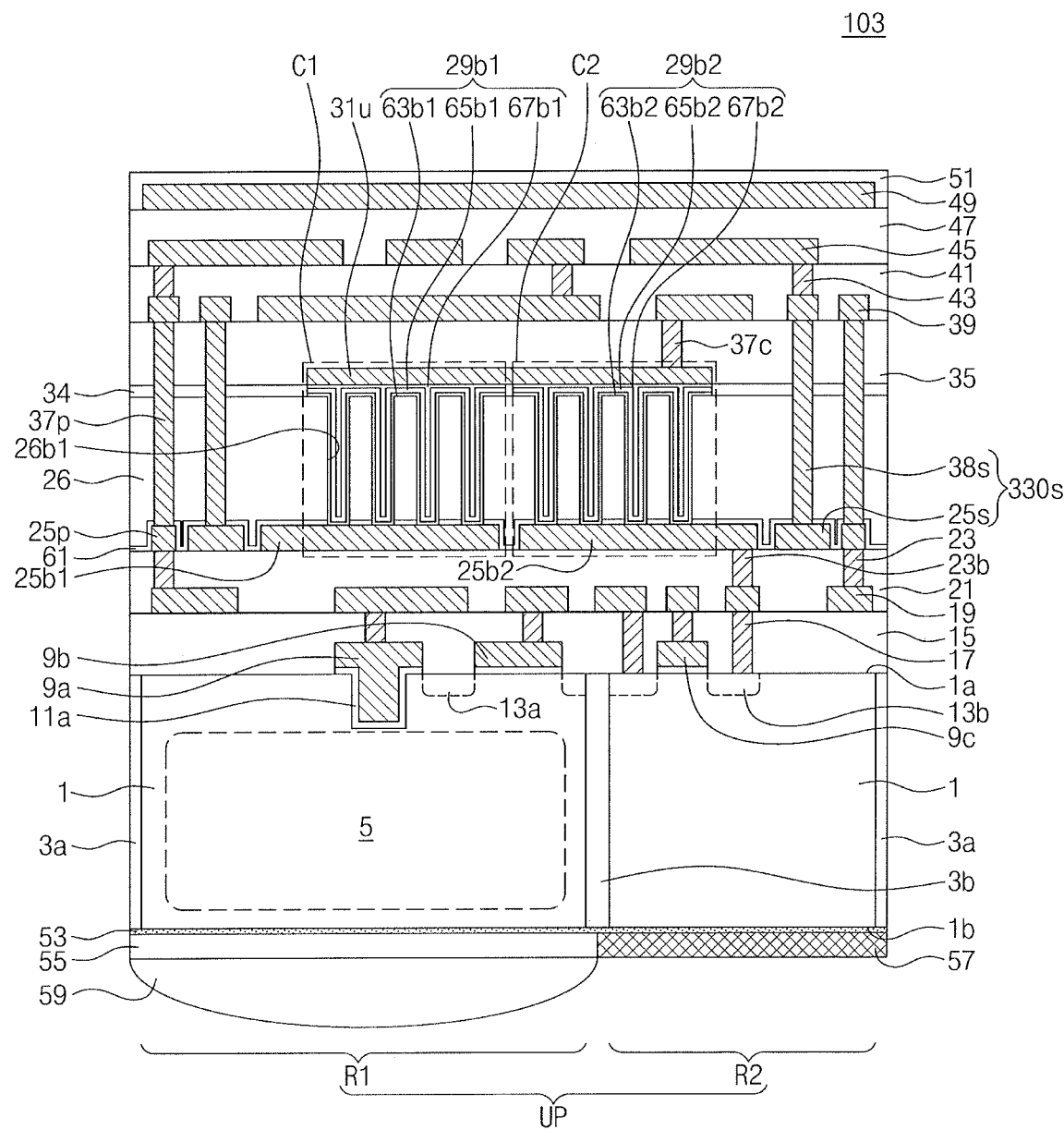
FIG. 18 illustrates a cross-sectional view taken along line A-A' of FIG. 17.

FIG. 17 illustrates a plan view showing an image sensor according to an example embodiment. FIG. 18 illustrates a cross-sectional view taken along line A-A' of FIG. 17.

Referring to FIGS. 17 and 18, an image sensor 103 according to an example embodiment may include a shield structure 330s whose structure is different from that of the shield structure 33s included in the image sensor 101 of FIG. 11. The dummy bottom electrode 25s and a shield pattern 38s on the dummy bottom electrode 25s may constitute the shield structure 330s. The shield pattern 38s may penetrate the third interlayer dielectric layer 35, connecting the dummy bottom electrode 25s to one of the third wiring lines 39. The shield pattern 38s may have a closed loop shape that surrounds the first and second capacitors C1 and C2. The shield pattern 38s may include the same material as that of the third edge contact plug 37p, may be located at the same height as that of the third edge contact plug 37p, and may have the same vertical length as that of the third edge contact plug 37p. The shield pattern 38s and the third edge contact plug 37p may be formed at the same time. Other configurations and fabrication processes may be identical or similar to those discussed with reference to FIGS. 11 to 14.

Figure 19:
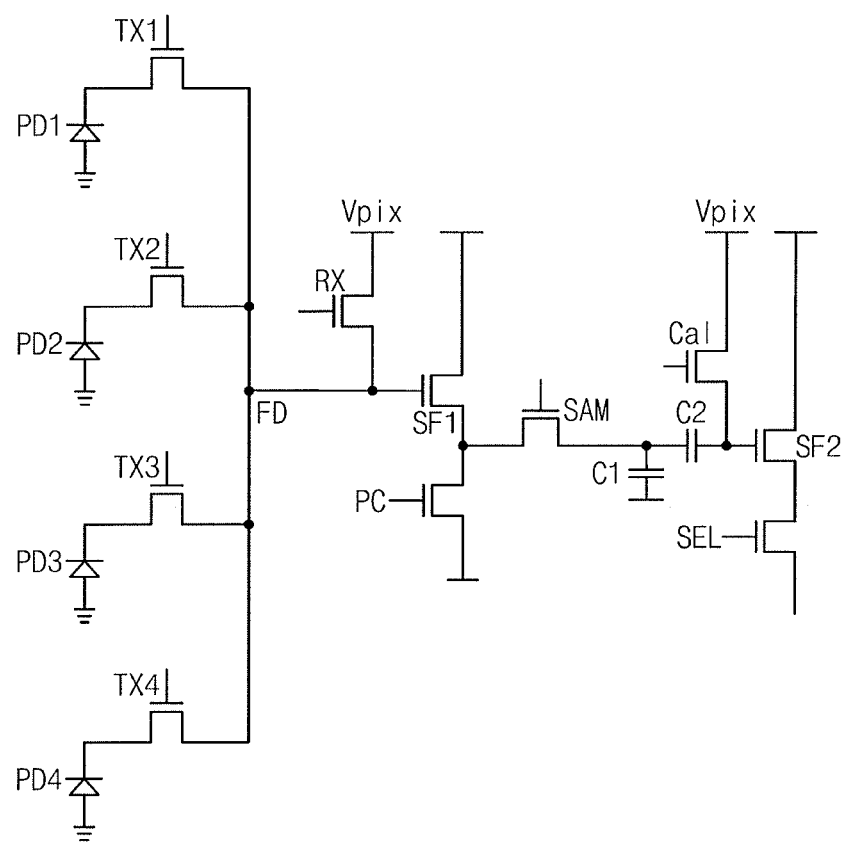
FIG. 19 illustrates a circuit diagram showing an image sensor according to an example embodiment.

FIG. 19 illustrates a circuit diagram showing an image sensor according to an example embodiment.

Referring to FIG. 19, four transfer transistors TX1, TX2, TX3, and TX4 may share one floating diffusion region FD. In this case, four first regions R1 may be disposed adjacent to each other. The four transfer transistors TX1, TX2, TX3, and TX4 may be turned on in sequence. For example, when the first transfer transistor TX1 is turned on, charges accumulated in a first photoelectric conversion region PD1 may be sensed by the operation discussed with reference to FIG. 2. The same operation may be sequentially performed on the second, third, and fourth transfer transistors TX2, TX3, and TX4.

Figure 20:
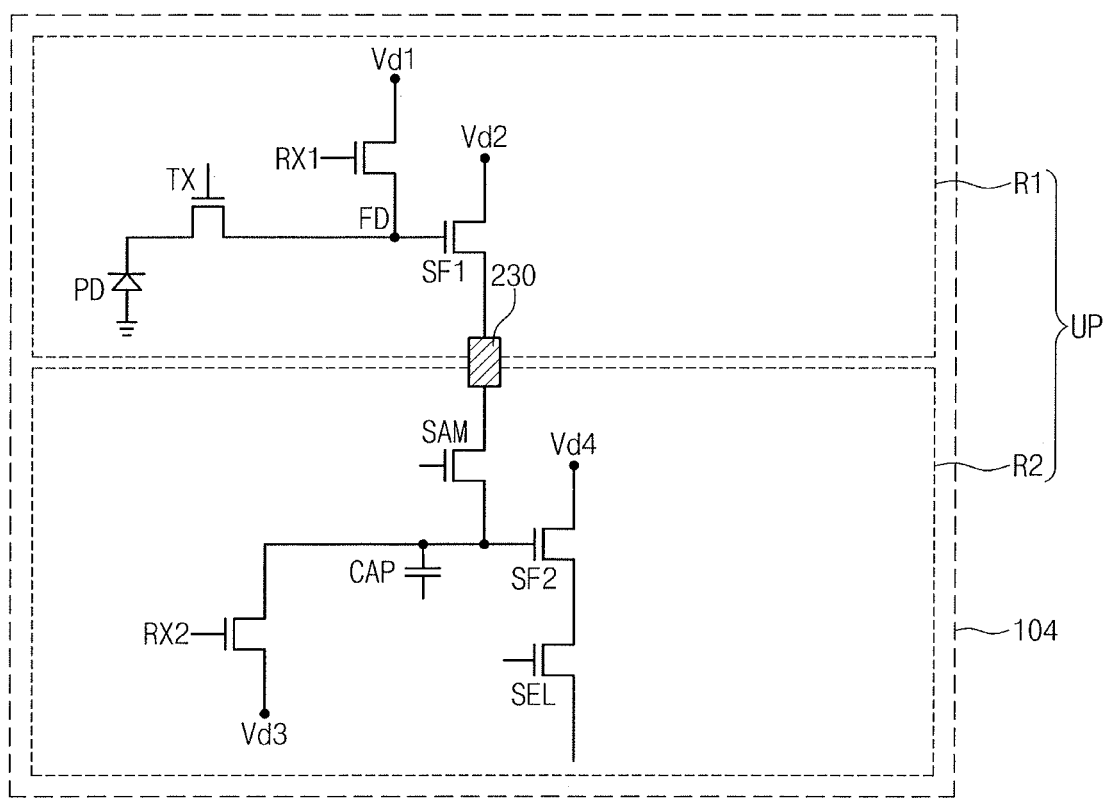
FIG. 20 illustrates a circuit diagram showing an image sensor according to an example embodiment.
Figure 21:
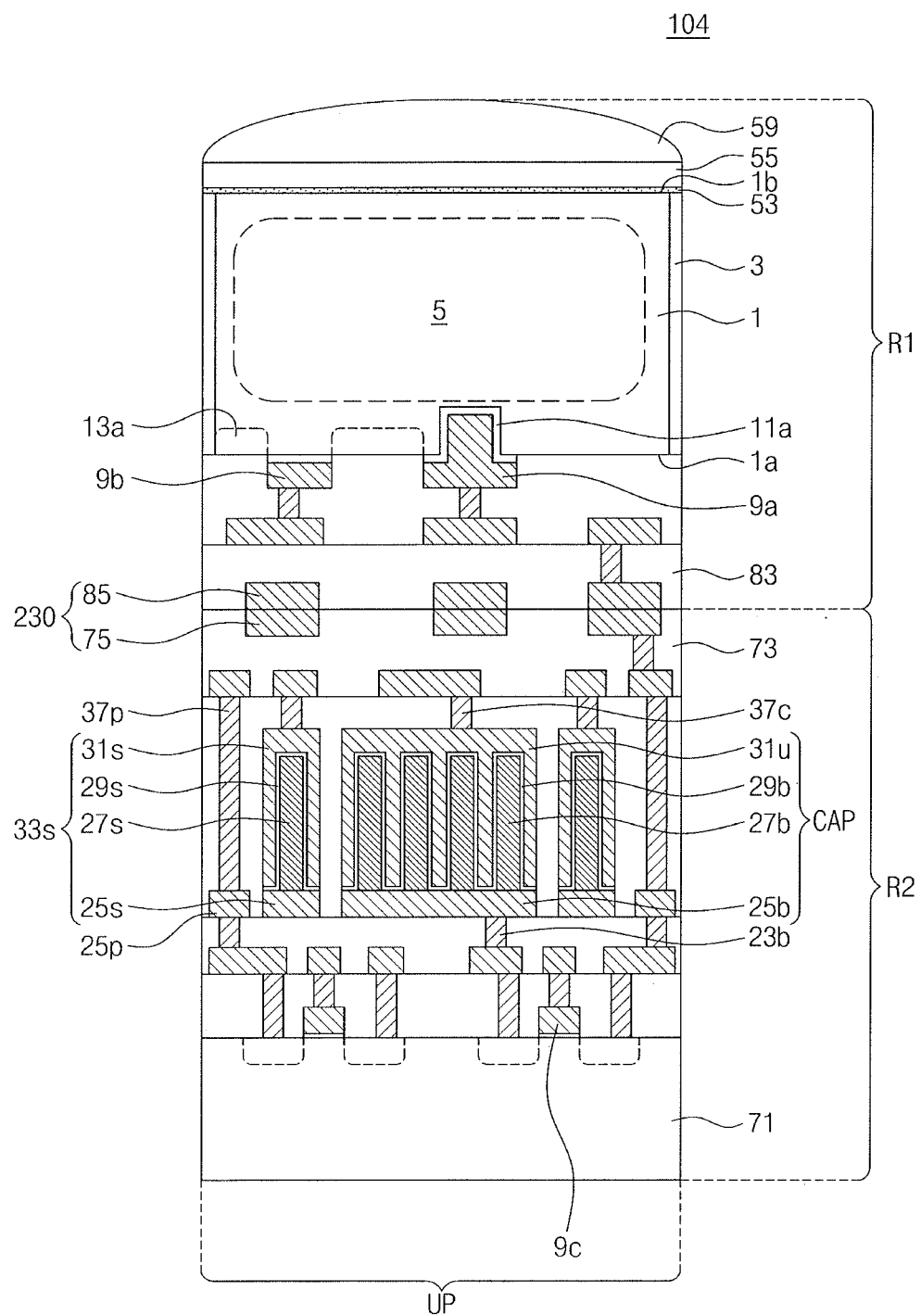
FIG. 21 illustrates a cross-sectional view showing an image sensor according to an example embodiment.

FIG. 20 illustrates a circuit diagram showing an image sensor according to an example embodiment. FIG. 21 illustrates a cross-sectional view showing an image sensor according to an example embodiment.

Referring to FIGS. 20 and 21, an image sensor 104 according to an example embodiment may include the first region R1 and the second region R2 that have different semiconductor chips from each other. For example, the first region R1 may correspond to a first semiconductor chip including a first substrate 1, and the second region R2 may correspond to a second semiconductor chip including a second substrate 71 that stands opposite to the first substrate 1. The first region R1 may include a photoelectric conversion region PD, a transfer transistor TX, a floating diffusion region FD, a first reset transistor RX1, and a first source follower transistor SF1. The second region R2 may include a sampling transistor SAM, a capacitor CAP, a second reset transistor RX2, a second source follower transistor SF2, and a selection transistor SEL. The first region R1 and the second region R2 may have therebetween a connector 230 that couples a first terminal of the first source follower transistor SF1 to a first terminal of the sampling transistor SAM.

The first substrate 1 may have a first surface 1a and a second surface 1b facing each other. A deep device isolation layer 3 may be disposed in the first substrate 1, confining a pixel. The first substrate 1 may be doped with impurities of a first conductivity type. The first substrate 1 may be provided therein with a first impurity region 5 of a second conductivity type. A first gate electrode 9a and a second gate electrode 9b may be disposed on the first surface 1a of the first substrate 1. The image sensor 104 may not include the second deep device isolation layer 3b of FIG. 4. The first surface 1a of the first substrate 1 may include thereon a plurality of first interlayer dielectric layer 83 and first wiring lines 85.

A third gate electrode 9c may be disposed on the second substrate 71. The third gate electrode 9c may correspond to, for example, a gate of the sampling transistor SAM. A plurality of second interlayer dielectric layers 73 may be disposed on the second substrate 71. A second bottom-electrode contact plug 23b, the capacitor CAP, a shield structure 33s, and second wiring lines 75 may be disposed in the second interlayer dielectric layers 73. One capacitor CAP may be present in one pixel UP. When viewed in plan, the shield structure 33s may have a closed loop shape that surrounds the capacitor CAP. A lowermost one of the first interlayer dielectric layers 83 may contact an uppermost one of the second interlayer dielectric layers 73. A lowermost one of the first wiring lines 85 and an uppermost one of the second wiring lines 75 may be in contact with each other to constitute the connector 230. Other configurations may be identical or similar to those discussed above with reference to FIG. 4.

The capacitor CAP of FIG. 21 may have a structure identical or similar to that of the first capacitor C1 discussed with reference to FIG. 11 or that of the second capacitor C2 discussed with reference to FIG. 11. The shield structure 33s may have a structure identical or similar to that of the shield structure 33s discussed with reference to FIG. 11 or that of the shield structure 330s discussed with reference to FIG. 16.

According to an example embodiment, an image sensor may include a shield structure that surrounds a capacitor. A parasitic capacitance may be prevented or minimized between conductive lines adjacent to the capacitor, which may result in a reduction in coupling noise. Therefore, the image sensor may produce a sharp image.

As described above, example embodiments may provide an image sensor capable of achieving sharp image quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a first substrate including a plurality of pixels;
a photoelectric conversion region in the first substrate at each of the pixels;
a first capacitor on the first substrate; and
a shield structure spaced apart from the first capacitor and surrounding the first capacitor, wherein:
a bottom surface of the shield structure is located at a same height as a bottom surface of the first capacitor, and
a top surface of the shield structure is located at a height that is the same as or greater than a top surface of first capacitor.

2. The image sensor as claimed in claim 1, further comprising a second capacitor on the first substrate and spaced apart from the first capacitor,
wherein the first capacitor and the second capacitor share one top electrode.

3. The image sensor as claimed in claim 2, wherein the shield structure surrounds the first capacitor and the second capacitor.

4. The image sensor as claimed in claim 1, wherein
the first capacitor includes a bottom electrode, a top electrode, and a dielectric layer interposed between the bottom electrode and the top electrode, and
the shield structure includes a dummy bottom electrode, a dummy top electrode, and a dummy dielectric layer interposed between the dummy bottom electrode and the dummy top electrode.

5. The image sensor as claimed in claim 4, wherein:
the first capacitor further includes a plurality of conductive pillars between the bottom electrode and the dielectric layer, the conductive pillars being spaced apart from each other, and
the shield structure further includes a plurality of dummy conductive pillars between the dummy bottom electrode and the dummy dielectric layer, the dummy conductive pillars being spaced apart from each other.

6. The image sensor as claimed in claim 4, further comprising a mold layer between the dielectric layer and the bottom electrode,
wherein the mold layer includes a plurality of pillar holes spaced apart from each other, the pillar holes exposing the bottom electrode, and
wherein the dielectric layer extends into the pillar holes and is in contact with the bottom electrode.

7. The image sensor as claimed in claim 6, wherein
the mold layer extends to be interposed between the dummy dielectric layer and the dummy bottom electrode,
the mold layer further includes a plurality of dummy pillar holes spaced apart from each other, the dummy pillar holes exposing the dummy bottom electrode, and
the dummy dielectric layer extends into the dummy pillar holes and is in contact with the dummy bottom electrode.

8. The image sensor as claimed in claim 1, wherein
the first capacitor includes a bottom electrode, a top electrode, and a dielectric layer interposed between the bottom electrode and the top electrode,
the image sensor further comprises:
a first interlayer dielectric layer that covers the top electrode; and
a first contact plug that penetrates the first interlayer dielectric layer, and
the shield structure includes a first sub-shield structure that penetrates the first interlayer dielectric layer, the first sub-shield structure having a top surface at the same height as that of a top surface of the first contact plug.

9. The image sensor as claimed in claim 8, further comprising a first conductive pad below the first contact plug and at the same height as that of the bottom electrode,
wherein the shield structure further includes a second sub-shield structure below the first sub-shield structure and at the same height as that of the bottom electrode.

10. The image sensor as claimed in claim 8, further comprising a mold layer between the dielectric layer and the bottom electrode,
wherein the mold layer includes a plurality of pillar holes spaced apart from each other, the pillar holes exposing the bottom electrode, and
wherein the dielectric layer extends into the pillar holes and is in contact with the bottom electrode.

11. The image sensor as claimed in claim 10, wherein the mold layer extends laterally, and
the first contact plug and the shield structure penetrate the mold layer.

12. The image sensor as claimed in claim 8, wherein the first contact plug is provided in plural,
wherein the plurality of first contact plugs are spaced apart from each other and disposed to surround the shield structure.

13. The image sensor as claimed in claim 1, further comprising:
a first transistor disposed on the first substrate and transferring charges generated from the photoelectric conversion region; and
a second transistor disposed on the first substrate and electrically connected to the first capacitor.

14. The image sensor as claimed in claim 1, further comprising:
a first transistor disposed on the first substrate and transferring charges generated from the photoelectric conversion region;
a second substrate that stands opposite to the first substrate; and
a second transistor disposed on the second substrate and electrically connected to the first capacitor.

15. An image sensor, comprising:
a substrate including a plurality of pixels;
a photoelectric conversion region in the substrate at each of the pixels;
at least one capacitor on the substrate;
a conductive pattern adjacent to the at least one capacitor; and
a shield structure between the at least one capacitor and the conductive pattern, wherein:
a bottom surface of the shield structure is located at a same height as a bottom surface of the at least one capacitor, and
a top surface of the shield structure is located at a height that is the same as or greater than a top surface of the at least one capacitor.

16. The image sensor as claimed in claim 15, wherein the shield structure surrounds the at least one capacitor.

17. An image sensor, comprising:
a first substrate including a plurality of pixels;
a photoelectric conversion region in the first substrate at each of the pixels;
a first capacitor and a second capacitor on the first substrate; and
a shield structure spaced apart from and surrounding the first capacitor and the second capacitor, wherein the shield structure includes a dummy bottom electrode, a dummy top electrode, and a dummy dielectric layer between the dummy bottom electrode and the dummy top electrode.

18. The image sensor as claimed in claim 17, wherein:
each of the first capacitor and the second capacitor includes a bottom electrode and a dielectric layer, and
the first capacitor and the second capacitor share one top electrode.

* * * * *